US007140298B2

(12) United States Patent
Aono et al.

(10) Patent No.: US 7,140,298 B2
(45) Date of Patent: Nov. 28, 2006

(54) METHOD FOR EVALUATING PLANOGRAPHIC PRINTING PLATES AND QUALITY-CONTROL METHOD THEREOF

(75) Inventors: Koichiro Aono, Shizuoka-ken (JP); Fumikazu Kobayashi, Shizuoka-ken (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 198 days.

(21) Appl. No.: 10/983,585

(22) Filed: Nov. 9, 2004

(65) Prior Publication Data

US 2005/0100825 A1 May 12, 2005

(30) Foreign Application Priority Data

Nov. 11, 2003 (JP) .............................. 2003-381242

(51) Int. Cl.
*G03F 7/26* (2006.01)
*G03F 7/22* (2006.01)
*G03F 9/00* (2006.01)

(52) U.S. Cl. ...................... 101/467; 101/484; 101/485; 101/481; 101/463.1

(58) Field of Classification Search ................. 101/467
See application file for complete search history.

(56) References Cited

FOREIGN PATENT DOCUMENTS

JP 2001-13692 A 1/2001

*Primary Examiner*—Andrew H. Hirshfeld
*Assistant Examiner*—Joshua Zimmerman
(74) *Attorney, Agent, or Firm*—Sughrue Mion, PLLC

(57) ABSTRACT

A method for evaluating planographic printing plates according to the present invention includes: a step (A) of exposing a planographic printing plate precursor by irradiating a thin-line image of a one-pixel line and at least one thin-line image selected from two- to eight-pixel lines by incrementally altering the plate-surface energy; developing the exposed plate precursor with a standard developer; and identifying an exposure intensity (hereinafter, "thin-line sensitivity") that respectively provides the images thus formed, with the same density; a step (B) of preparing another planographic printing plate precursor under the same conditions as in the step (A) and identifying the thin-line sensitivity, except that the planographic printing plate precursor is developed with a test developer; a step (C) of comparing the thin-line sensitivities respectively obtained in the steps (A) and (B); and a step (D) of adjusting plate-making conditions when the results of the comparison in the step (C) show a difference between the respective thin-line sensitivities that exceeds a predetermined value.

21 Claims, No Drawings

METHOD FOR EVALUATING PLANOGRAPHIC PRINTING PLATES AND QUALITY-CONTROL METHOD THEREOF

CROSS-REFERENCE TO RELATED APPLICATION

This application claims priority under 35 USC 119 from Japanese Patent Application No. 2003-381242, filed Nov. 11, 2003, the disclosure of which is incorporated by reference herein.

BACKGROUND OF THE INVENTION

1. Field of the Invention

The present invention relates to an image evaluation method and a quality control method suitable for a positive planographic printing plate for use with an IR laser, which printing plate is generally called direct plate-making type, capable of direct plate-making from digital signals of computers or the like.

2. Description of the Related Art

In recent years, laser development has been remarkable. Specifically, a solid state laser and a semiconductor laser having a light emitting region in a range from near IR to an IR region have been developed to have high output and small size. Accordingly, as an exposure light source at the time of direct plate making from digital data of a computer or the like, such lasers are extremely useful.

A positive planographic printing plate precursor for IR laser, for which the above-mentioned IR laser having a light emitting region in the IR region is used as an exposure light source, is a planographic printing plate precursor (hereinafter, referred to simply as a PS plate in some cases) that comprises an aqueous alkaline solution-soluble binder resin, an IR dye, which absorbs light and generates heat, and the like as essential components.

When the positive planographic printing plate precursor for IR lasers is exposed with an IR laser beam, in non-exposed portions (i.e., image portions), the IR dye or the like in the photosensitive layer continues to work as a dissolution inhibitor to substantially decrease the solubility of the binder resin, due to the interaction between the IR dye and the binder resin. On the other hand, in exposed portions (non-image portions), the IR dye or the like absorbs light and generates heat, so that the interaction of the IR dye or the like with the binder resin is weakened. Accordingly, at a time of development, the exposed portions (non-image portions) are dissolved in an alkaline developer to produce image portions.

However, as compared with a positive planographic printing plate precursor to be used for plate-making by UV exposure, such a positive planographic printing plate precursor for IR lasers has a narrow latitude with respect to the activity of a developer and therefore, has problems wherein if the activity is too high, the image part density and printing resistance are decreased and if the activity is too low, development failure easily occurs.

The above-mentioned problems are attributed to the following basic differences in the plate-making mechanisms between the above-mentioned positive planographic printing plate precursor for IR lasers and the positive planographic printing plate precursor for plate-making by UV exposure.

The photosensitive layer of the positive planographic printing plate precursor for plate-making by UV exposure comprises an aqueous alkaline solution-soluble binder resin and an onium salt or quinone diazide compound as essential components. When such a positive planographic printing plate precursor is exposed, the onium salt or quinone diazide compound works in the non-exposed portions (image portions) as a dissolution inhibitor similar to the case of the positive planographic printing plate precursor for IR lasers. However, unlike the case of the positive planographic printing plate precursor for IR lasers, in the exposed portions (non-image portions), it is decomposed by light, and generates an acid, and consequently works as a dissolution promoting agent for the binder resin. Accordingly, in the positive planographic printing plate precursor for plate making by UV exposure, the difference in the solubility with respect to an alkaline developer between the exposed portions and the non-exposed portions is very large.

In contrast, with respect to the positive planographic printing plate precursor for IR lasers, although the interaction between the IR dye and the binder resin is weakened in the exposed portions (non-image portions) at a time of exposure, the IR dye does not work as the dissolution promoting agent for the binder and therefore, the difference in the solubility between the non-exposed parts and the exposed parts is small.

Due to the above-mentioned reasons, when a planographic printing plate precursor such as a positive planographic printing plate precursor for IR laser having a narrow latitude to the activity of a developer is used, it is very difficult to control the plate making process to continuously form stable images.

Generally, in the case of developing the positive planographic printing plate precursor for IR lasers, an automatic developing apparatus having a replenishing mechanism for keeping the developer sensitivity constant as much as possible is employed. The replenishing mechanism is for adding a highly active replenisher so as to prevent pH decrease and deterioration of the developability of the developer due to developing of the plates or $CO_2$ absorption.

Practically, in a treatment system for a regular PS plate, the proposed examples of the replenishing mechanism include: a method of adding a replenisher so as to keep conductivity constant; and a method of adding a predetermined amount of a replenisher periodically after the number of plates developed from planographic printing plate precursors reaches a predetermined number or after a predetermined treatment time passes.

However, in the method for controlling a replenisher based on the conductivity, there arises a problem in that pH values vary (thus developability also changes), even at the same condctivity, between the starting time of development and a later stage, because significantly amounts of compositions of a photosensitive layer are dissolved into the developer as the number of the developed plates increases.

Further, in the method of adding a predetermined amount of the replenisher periodically or according to the number of the developed plates, as the amount of the (applied) replenisher per unit surface area of a plate is fixed, the method cannot address to changes such as: the amount of compositions of the photosensitive layer dissolved into a developer varying in accordance with the area of image portions; and the $CO_2$ absorption amount changing over time depending on the installation environment (temperature, humidity, $CO_2$ concentration and the like) of the automatic developing apparatus. Thus, it is difficult to continuously keep the constant developability by control with such a method of periodically adding a predetermined amount of the replenisher.

In addition, there is also known a quality-control method of: obtaining the clear sensitivity of an image formed by developing a positive planographic printing plate precursor for infrared laser with a standard developer; obtaining the clear sensitivity of an image formed by developing the same plate with a worn-out developer; and adjusting plate-making conditions based on the comparison of the two results of the clear sensitivity. However, there remains room for improvement with respect to production of high-quality printed matter such as art books, car catalogues, and the like, and high-definition printed matter such as FM and AM screens having a density of 300 lines/inch (2.54 cm) or higher (see, for example, Japanese Patent Application Laid-Open (JP-A) No. 2001-13692).

Generally, in a widely used planographic printing plate precursor using UV exposure, since the precursor has a wide latitude with respect to the activity of a developer, the fluctuation of the developability as described above is not a major problem. However, as described above, since the positive planographic printing plate precursor for IR lasers has a narrow latitude with respect to the activity of the developer, the image formability, especially the dot formability, fluctuates considerably depending on changes in the activity of the developer, which results in problems regarding quality of the planographic printing plate.

Currently, however, no method has yet been discovered that can be applied to general-purpose positive-type planographic printing plate precursors for infrared laser to effectively prevent fluctuation in the image portion area and peripheral length of very fine dots by means of simplified process control.

SUMMARY OF THE INVENTION

An object of the present invention, which has been completed with consideration of the problems of the conventional art described above, is to provide a simplified evaluation method for evaluating plate-making conditions, in direct plate-making, for positive-type planographic printing plate precursors for infrared laser and, in particular, for evaluating the active capacity of a developer. A further object of the invention is to provide a quality-control method, in order to maintain the quality of the planographic printing plates and to consistently form uniform images, by means of feeding the results of the evaluation back into the plate-making process.

After extensive research, the present inventors have found that it is possible to effect evaluation of formed images, in a simple manner, by developing and plate-making, under standard conditions, a planographic printing plate precursor that has been exposed under specific conditions, then developing and plate-making an identical planographic printing plate precursor under conditions to be evaluated, and comparing the results. The inventors also found that it is possible to conduct simplifed quality control of planographic printing plates by feeding the evaluation results back into the plate-making process and, using these discoveries, they completed the present invention.

Therefore, according to a first aspect of the invention, a method for evaluating planographic printing plates comprises:

a step (A) of subjecting a planographic printing plate precursor having a support and a photosensitive layer provided on the support, the photosensitive layer containing an aqueous alkaline solution-soluble resin and a compound that generates heat by absorbing light (hereinafter, which will occasionally be referred to simply as "planographic printing plate precursor"), to exposure such that a thin-line image of a one-pixel line and at least one thin-line image selected from two- to eight-pixel lines of predetermined resolution are exposed by incrementally altering the plate-surface energy; producing a standard developer-processed planographic printing plate by developing the exposed plate precursor with a standard developer; identifying an exposure intensity (hereinafter, which exposure intensity will be referred to as "thin-line sensitivity") that respectively provides the thin-line image of the one-pixel line and the at least one thin-line image selected from two- to eight-pixel lines with identical density;

a step (B) of forming a test developer-processed planographic printing plate by developing a planographic printing plate, exposed to images identical to those in step (A) under identical conditions, with a developer to be evaluated; and identifying an exposure intensity (thin-line sensitivity) that respectively provides the thin-line image of the one-pixel line and the at least one thin-line image selected from two- to eight-pixel lines with identical density;

and a step (C) of comparing the thin-line sensitivity of the standard developer-processed planographic printing plate and the thin-line sensitivity of the test developer-processed planographic printing plate.

According to a second aspect of the invention, a quality-control method for planographic printing plates comprises:

a step (A) of subjecting a planographic printing plate precursor having a support and a photosensitive layer provided on the support, the photosensitive layer containing an aqueous alkaline solution-soluble resin and a compound that generates heat by absorbing light, to exposure such that a thin-line image of a one-pixel line and at least one thin-line image selected from two- to eight-pixel lines of predetermined resolution are exposed by incrementally altering the plate-surface energy; producing a standard developer-processed planographic printing plate by developing the exposed plate precursor with a standard developer; and determining the thin-line sensitivity thereof;

a step (B) of forming a test developer-processed planographic printing plate by developing a planographic printing plate, exposed to images identical to those in step (A) under identical conditions, with a developer to be evaluated; and determining the thin-line sensitivity thereof;

a step (C) of comparing the thin-line sensitivity of the standard developer-processed planographic printing plate with that of the test developer-processed planographic printing plate;

and a step (D) of adjusting the plate-making conditions when the results of the comparison in step (C) show a difference between the respective thin-line sensitivities that exceeds a predetermined value.

Additionally, according to a third aspect of the invention, a method for evaluating planographic printing plates comprises:

a step (A) of subjecting a planographic printing plate precursor having a support and a photosensitive layer provided on the support, the photosensitive layer containing an aqueous alkaline solution-soluble resin and a compound that generates heat by absorbing light, to exposure such that a checked image of a one-pixel and at least one checked image selected from two- to eight-pixel images of predetermined resolution are exposed by incrementally altering the plate-surface energy; forming a standard developer-processed planographic printing plate by developing the exposed plate precursor with a standard developer; and identifying an exposure intensity (hereinafter, which exposure intensity will be referred to as "checked-image sensitivity") that respectively provides the checked image of one pixel and the at least one checked image selected from two- to eight-pixel images with identical density;

a step (B) of forming a test developer-processed planographic printing plate by developing a planographic printing plate, exposed to images identical to those in step (A) under identical conditions, with a developer to be evaluated; and identifying an exposure intensity (checked-image sensitivity) that respectively provides the checked image of one pixel and the at least one checked image selected from two- to eight-pixel images with identical density;

and a step (C) of comparing the checked-image sensitivity of the standard developer-processed planographic printing plate with that of the test developer-processed planographic printing plate.

According to a fourth aspect of the invention, a quality-control method for planographic printing plates comprises:

a step (A) of subjecting a planographic printing plate precursor having a support and a photosensitive layer provided on the support, the photosensitive layer containing an aqueous alkaline solution-soluble resin and a compound that generates heat by absorbing light, to exposure such that a checked image of a one-pixel and at least one checked image selected from two- to eight-pixel images of predetermined resolution are exposed by incrementally altering the plate-surface energy; forming a standard developer-processed planographic printing plate by developing the exposed plate precursor with a standard developer; and determining the checked-image sensitivity thereof;

a step (B) of forming a test developer-processed planographic printing plate by developing a planographic printing plate, exposed to images identical to those in step (A) under identical conditions, with a developer to be evaluated; and determining the checked-image sensitivity thereof;

a step (C) of comparing the respective checked-image sensitivities of the standard developer-processed planographic printing plate and the test developer-processed planographic printing plate;

and a step (D) of adjusting the plate-making conditions when the results of the comparison in step (C) show a difference between the respective thin-line sensitivities that exceeds a predetermined value.

In addition, in the second or fourth aspects of the invention, when the plate-making condition adjusted in step (D) above is a developing condition, steps (A) to (D) are preferably repeated in the same order once or multiple times and under the same conditions except that the developing condition in step (A) is changed to the developing condition previously adjusted in step (D).

Further, in the second or fourth aspects of the invention, when the plate-making condition adjusted in step (D) is an exposure condition, steps (A) to (D) are preferably conducted in the same order once or multiple times, using the test developer-processed planographic printing plate previously obtained in step (B) as the standard developer-processed planographic printing plate in step (A).

The present invention provides a simplified evaluation method for evaluating plate-making conditions, in direct plate-making, for positive-type planographic printing plate precursors for infrared laser and, in particular, for evaluating the active capacity of a developer, and also provides a quality-control method to maintain the quality of planographic printing plates and consistently form uniform images by feeding evaluation results back into the plate-making process.

DETAILED DESCRIPTION OF THE INVENTION (Method for Evaluating Planographic Printing Plates by Using Thin-Line Sensitivity)

Steps (A) to (C) of the method for evaluating planographic printing plates by using thin-line sensitivity will be first described in detail.

<Step (A)>

In step (A), a planographic printing plate precursor is exposed at a predetermined resolution to a thin-line image of one-pixel line and at least one thin-line image selected from two- to eight-pixel lines while changing the plate-surface energy incrementally or stepwise.

In the present invention, a thin-line image of one-pixel line means an image consisting of multiple lines having a width identical with the length of a side of one-pixel image at a predetermined resolution arranged in an ordered manner at an interval (non-image portion) identical with the length of a side of the one pixel image.

The length of a side of an one-pixel image is dependent on the resolution of the image used, and, for example, the length of a side of an one-pixel image is 10.4 μm when the resolution is 2,438 dpi, and the length of a side of an one-pixel image when the resolution is 1,200 dpi is 21.2 μm. Accordingly, when the resolution is 2,438 dpi, a thin-line image having a line width of 10.4 μm (one-pixel line) is compared with a thin-line image having a line with of 20.4 μm (two-pixel line) to 83.2 μm (eight-pixel line).

The evaluation method according to the invention is applicable to printing at any resolution, but it is more advantageous to apply the method to evaluation of image formation of high-resolution images that demands normally a higher grade evaluation technology. In this regard, it is preferable that the method is applied to evaluation of images having a resolution of 1,200 dpi or more.

The area of the thin-line image to be evaluated is arbitrary but at least one side thereof is preferably 7 mm or more, considering the minimum measurable area of densitometer.

The exposure intensity during the exposure while changing the plate-surface energy incrementally is favorably in a range of exposure intensity from that identical with that of unexposed areas to that 1.5 times larger than the thin-line sensitivity. During the exposure by changing the plate-surface energy incrementally in this range, the difference in plate-surface energy (variation) between the adjacent energy levels is preferably 2 to 10% of the clear sensitivity of the image developed with a standard developer.

Then, a standard developer-processed planographic printing plate is prepared by developing the exposed planographic printing plate precursor with a standard developer. The standard developer in the invention indicates a standard developer used for developing common positive planographic printing plate precursors, and is selected properly according to the properties of the planographic printing plate precursor applied. The standard developer will be described in detail below.

Then, an exposure intensity (thin-line sensitivity) that provides a density of the thin-line image of one-pixel line identical with that of the at least one thin-line image selected from two- to eight-pixel lines, formed on the standard developer-processed planographic printing plate, is identified. The comparison of the thin-line image densities, which is comparison of a pair of images in the present case, may be carried out by visual observation of the plates but is preferably by using a densitometer from the viewpoints of convenience and accuracy.

The standard developer-processed planographic printing plate thus prepared is a standard sample representing the base developing condition. The composition of the developer, processing time, processing temperature, and the like used here are the standard condition. The standard developer-processed planographic printing plate need not be prepared for every evaluation, and it suffices that a single standard plate is produced at the first stage if the evaluation and control is performed in continuous steps for the same plate-making.

<Step (B)>

In step (B), a planographic printing plate to be evaluated is prepared. The step is aimed at evaluation of "fatigue" of the developer over time and the like, and includes, at the time when the evaluation is needed, the steps of forming a test developer-processed planographic printing plate by developing a planographic printing plate exposed to an image similar to that in step (A) under a similar condition with a test developer, and identifying an exposure intensity (thin-line sensitivity) that provides the density of the thin-line image of one-pixel line which density is identical with that of the thin-line image selected in step (A).

For example, when the thin-line sensitivities of a thin-line image of one-pixel line and a thin-line image of five-pixel line are evaluated in step (A), the thin-line sensitivities of the thin-line image of one-pixel line and the thin-line image of five-pixel line, formed on the test developer-processed planographic printing plate in step (B), are determined similarly.

The thin-line image to be evaluated is not particularly limited to a single image. For example, when the thin-line sensitivities of a thin-line image of one-pixel line and thin-line images of two- and three-pixel lines are obtained in step (A), the thin-line sensitivities of a thin-line image of one-pixel line and thin-line images of two- and three-pixel lines, formed on the test developer-processed planographic printing plate, are evaluated in step (B).

Further, the thin-line sensitivity is determined in a similar manner to step (A), regarding developing temperature, processing time, and the like, except that the plate is developed with the test developer.

<Step (C)>

In step (C), the thin-line sensitivity of the standard developer-processed planographic printing plate obtained in step (A) is compared with the thin-line sensitivity of the test developer-processed planographic printing plate obtained in step (B).

If the difference between the thin-line sensitivities turns out to be greater than a predetermined value after comparison, it is judged that the active capacity of the test developer used for the test developer-processed planographic printing plate has been decreased.

The aforementioned "predetermined value" is the maximum difference in thin-line sensitivity that can be tolerated, in terms of constantly maintaining the desired image quality and determined by the desired uniformity of the planographic printing plates. The maximum difference is generally a difference of ±10% by which the thin-line sensitivity of the test developer-processed planographic printing plate differs from the thin-line sensitivity of the standard developer-processed planographic printing plate. The difference of ±10% is generally regarded as the lowest degree of difference at which, when the images of the two types of pranographic printing plates are compared with each other, difference in images can be visually observed.

In this manner, the change in exposure and developing conditions can be easily detected by comparing a test sample with the sample subjected to development with the standard developer.

(Quality-Control Method for Planographic Printing Plates by Using Thin-Line Sensitivity)

Hereinafter, steps (A) to (D) of the quality-control method for planographic printing plates by using thin-line sensitivity of the present invention will be described in detail.

Among the steps (A) to (D) of the quality-control method for planographic printing plates by using thin-line sensitivity according to the invention, steps (A) to (C) are the same as those in steps (A) to (C) of the method for evaluating planographic printing plates.

<Step (D)>

In step (D), the plate-making conditions are adjusted according to the evaluation results obtained in steps (A) to (C). If the difference in thin-line sensitivities is greater than a predetermined value after comparison, between the standard developer-processed planographic printing plate and the test developer-processed planographic printing plate, quality control measures for the planographic printing plates can be taken rationally by feeding the evaluation result back to the plate-making conditions.

The means for adjusting the plate-making conditions is not particularly limited, but the adjustment of the exposure conditions and/or developing conditions is preferred.

Hereinafter, counter measures to be taken when the thin-line sensitivity is beyond a predetermined range will be described.

If the active capacity of the developer has been deteriorated, that is, if the thin-line sensitivity of the test developer-processed planographic printing plate is higher than the thin-line sensitivity of the standard developer-processed planographic printing plate by the predetermined value or more, it is necessary to increase exposure level or activate the developing condition. Specifically, the means include the followings (1) to (10).

Means for adjusting the development conditions such that development capacity is fortified include:

(1) Adding water to the developer.
(2) Decreasing the dilution ratio of the replenishing solution (i.e., increasing the concentration of the developer).
(3) increasing the set amount of the replenishing solution (to be replenished) of the automatic developing apparatus.
(4) increasing the development temperature.
(5) prolonging the development duration (decreasing the transportation speed of the automatic developing apparatus).
(6) increasing the pressure of developing brushes of the automatic developing apparatus.
(7) increasing the number of the developing brushes of the automatic developing apparatus.
(8) increasing the spraying amount.
(9) Replacing the developer with a new developer.

Further, means for adjusting the exposure conditions or the like include:

(10) intensifying exposure.

In contrast, when it is judged that the developability is too strong, that is, if the thin-line sensitivity of the test developer-processed planographic printing plate is lower than the thin-line sensitivity of the standard developer-processed planographic printing plate by the predetermined value or more, it is necessary to decrease exposure level or moderate the developing condition. Specifically, the means include the followings (1) to (14).

Means for adjusting the development conditions such that development capacity is moderated include:

(1) Adding water to the developer.

(2) Adding dry ice to the developer.

(3) Blowing $CO_2$ gas in.

(4) increasing the dilution ratio of the replenishing solution (i.e., decreasing the concentration of the developer).

(5) Lessening the set amount of the replenishing solution (to be replenished) of the automatic developing apparatus.

(6) Decreasing the development temperature.

(7) Shortening the development duration (increasing the transportation speed of the automatic developing apparatus).

(8) Decreasing the pressure of developing brushes of the automatic developing apparatus.

(9) Lessening the number of the developing brushes of the automatic developing apparatus.

(10) Decreasing the spraying amount.

(11) Stirring the developer.

(12) Replacing the developer with a new developer.

Further, means for adjusting the exposure conditions or the like include:

(13) Decreasing the exposure extent.

(14) Heating the positive photosensitive planographic printing plate precursor for IR lasers before exposure.

In the case in which the exposure extent is to be controlled, conditions such as the output of laser beam, beam diameter, scanning speed, and exposure duration may properly be adjusted so that a desired exposure condition is obtained.

In the quality-control method for planographic printing plates according to the invention, if the plate-making condition adjusted in step (D) above is the developing condition, it is preferable that the steps (A) to (D) are carried out in that order once or multiple times in the same manner as before, except that the developing condition in step (A) is changed to the developing condition adjusted in the previous step (D).

Alternatively, if the plate-making condition adjusted in step (D) above is the exposure condition, it is preferable that the steps (A) to (D) are carried out in that order once or multiple times under the same conditions, except that the test developer-processed planographic printing plate obtained in previous step (B) is regarded as the standard developer-processed planographic printing plate in step (A).

By feeding the evaluation results back repeatedly in this manner, it becomes possible to keep the favorable quality of the planographic printing plates in a stable manner over an extended period of time.

In addition, the planographic printing plates to be used for the evaluation and quality control are prepared independently and intermittently, during production of commercial planographic printing plate products in a plate-making machine for use of general plate making, and the evaluation and quality control of the plate making conditions is carried out by examining the state of these specific printing plates. Alternatively, it is acceptable that the thin-line images are formed on the margin areas of the commercial planographic printing plate products (that is, frame portions of the planographic printing plates) for evaluation and quality control.

(Method for Evaluating Planographic Printing Plates by Using Checked-Image Sensitivity)

Hereinafter, the method for evaluating planographic printing plates by using checked-image sensitivity, of the present invention, will be described.

The method for evaluating planographic printing plates by using checked-image sensitivity is the same as the method for evaluating planographic printing plates by using thin-line sensitivity, except that the image irradiated on a planographic printing plate precursor to be evaluated is changed to a checked image of one pixel and at least one checked image selected from two- to eight-pixel images.

The checked image of one pixel in the invention represents a checked image in which the length of a side of each square is identical with the length of a side of a one-pixel image formed at a predetermined resolution. The checked image of two pixels represents a checked image in which the length of a side of each square is identical with the length of a two-pixel image formed at a predetermined resolution, that is, a checked image having an entire side length of four pixels. The length of a side of a one-pixel image may vary according to the resolution used, and the range of the resolution preferably applicable to the evaluation method by using checked-image sensitivity of the present invention is the same as that described for the evaluation method by using thin-line sensitivity.

(Quality-Control Method for Planographic Printing Plates by Using Checked-Image Sensitivity)

Hereinafter, the quality-control method for planographic printing plates by using checked-image sensitivity, of the present invention, will be described.

The quality-control method for planographic printing plates by using checked-image sensitivity is the same as the above-described quality-control method for planographic printing plates by using thin-line sensitivity, except that the image irradiated on a planographic printing plate precursor to be evaluated is changed to a checked image of one pixel and at least one checked image selected from two- to eight-pixel images.

[Planographic Printing Plate Precursor]

Hereinafter, planographic printing plate precursor to which the evaluation method and quality control method according to the invention is applied will be described.

The planographic printing plate precursor according to the invention is not particularly limited, as long as it comprises a support and a photosensitive layer provided on the support, the photosensitive layer containing an aqueous alkaline solution-soluble resin and a compound generating heat by absorbing light (which compound will hereinafter be referred to as "light-to-heat converting substance"). In other words, it suffices if the photosensitive layer comprises a positive photosensitive composition for infrared laser. Further, the photosensitive layer may contain any additives commonly used in general positive photosensitive compositions for infrared laser or the like. Hereinafter, each constituent of the planographic printing plate precursor according to the invention will be described in detail.

(Aqueous Alkaline Solution-Soluble Resin)

Any known aqueous alkaline solution-soluble resins may be used as the aqueous alkaline solution-soluble resin according to the invention without any restriction. Examples thereof include various aqueous alkaline solution-soluble polymer compounds including phenol-formaldehyde resins, cresol-formaldehyde resins, phenol-cresol-formaldehyde cocondensation resins, polyhydroxystyrene, copolymers of N-(4-hydroxyphenyl)methacrylamide, polymers having a carboxy group as the acidic group, acrylic resins and urethane resins having an acidic group such as a phenolic hydroxy group and a sulfonamide group, and the like.

(Specific Aqueous Alkaline Solution-Soluble Resin)

Among the aqueous alkaline solution-soluble resins, use of an aqueous alkaline solution-soluble resin containing an acrylic polymer at a content of 10 to 70 wt % (hereinafter, referred to as "specific aqueous alkaline solution-soluble resin") is preferable in the invention. The specific aqueous alkaline solution-soluble resin in the invention is an aqueous alkaline solution-soluble resin containing an acrylic polymer at a content of 10 to 70 wt %.

<Acrylic Polymer>

Acrylic polymers contained in the specific aqueous alkaline solution-soluble resins will be described hereinafter.

The acrylic polymer according to the invention is a polymer containing an acrylic monomer component such as a (meth)acryl acid derivative or the like as the co-polymerization component, and the acrylic polymer according to the invention can be obtained by homopolymerizing or copolymerizing such an acrylic monomer component.

In the present specification, acryl and methacrylic compounds are generally referred to as (meth)acrylic compounds. Compounds "containing a (meth)acrylic ester as the copolymerization component" represent compounds containing at least one of an acrylic ester and a methacrylic ester. The same applies to (meth)acrylamide derivatives.

The acrylic polymer according to the invention is preferably a water-insoluble and alkali-soluble acrylic polymer, and the water-insoluble and alkali-soluble acrylic polymers is preferably an acrylic polymer having an acidic group in the main and/or side chains of the polymer. Examples thereof include homopolymers or copolymers of acrylic monomers having an acidic group and a polymerizable unsaturated double bond in the molecule, and the mixtures thereof.

The acrylic monomer having an acidic group is not particularly limited if it is a monomer having an acidic group and a polymerizable unsaturated double bond in the molecule, and examples thereof include monomers described in JP-A No. 11-218914. The acrylic polymer according to the invention can be obtained by homopolymerizing or copolymerizing such an acrylic monomer having an acidic group.

The acrylic polymer preferably has one of the following acidic groups (1) to (5) as its acidic group in the polymer main and/or side chains, from the viewpoints of solubility in an alkaline developer and solubilization-suppresing potential.

(1) Sulfonamide group ($—SO_2NH—R$)

(2) Substituted acidic sulfonamide group (hereinafter, referred to as "active imide group") ($—SO_2NHCOR$, $—SO_2NHSO_2R$, $—CONHSO_2R$)

(3) Carboxylic acid group ($—CO_2H$)

(4) Sulfonic acid group ($—SO_3H$)

(5) Phosphoric acid group ($—OPO_3H_2$)

In the groups (1) to (5), R represents a hydrogen atom or a hydrocarbon group which may have a substituent group.

The acrylic polymer according to the invention is preferably an acrylic polymer that contains no phenolic hydroxyl group therein.

The acrylic polymer according to the invention is contained in the specific aqueous alkaline solution-soluble resin for use in the photosensitive layer in an amount in the range of 10 to 70 wt %. Use of a planographic printing plate precursor containing such a specific aqueous alkaline solution-soluble resin in the photosensitive layer enhances the advantageous effects by the plate-making method described below.

The acrylic polymer according to the invention will be described in more detail.

Preferable examples of the acrylic polymers according to the invention include: (a) copolymers having a monomer represented by the following Formula (a); (b) alkali-soluble polymer compounds having a sulfonamide group; and the like.

<<(a) Copolymer Having a Monomer Component Represented by Formula (a)>>

Copolymers having the monomer component represented by Formula (a) (hereinafter, referred to as "acrylic polymer (a)") will be first described.

Formula (a)

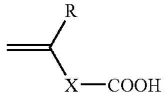

In Formula (a), R represents a hydrogen atom or an alkyl group, and preferably, a hydrogen atom or an alkyl group having 1 to 4 carbons. X represents an arylene group which may have a substituent group or one of the following structures.

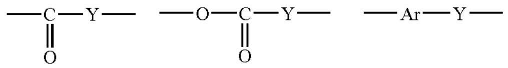

wherein, Ar represents an arylene group which may have a substituent group; and Y represents a bivalent linking group.

The bivalent linking group represented by Y is, for example, an alkylene group, arylene group, imide group, or alkoxy group which may have a substituent group. Examples of these substituent groups include an alkyl group, hydroxyl group, alkoxy group, halogen atom, phenyl group, dimethylamino group, ethyleneoxide group, vinyl group, o-carboxybenzoyloxy group, and the like.

Hereinafter, typical examples of the monomer components represented by Formula (a) will be described, but the invention is not restricted thereto.

a-1

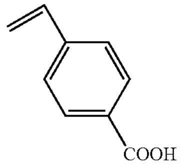

a-2

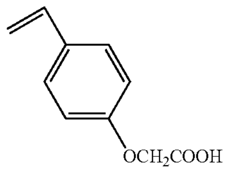

-continued
a-3
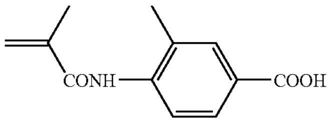
a-4
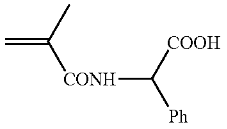
a-5
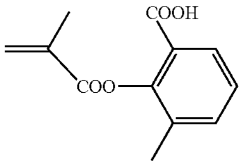
a-6
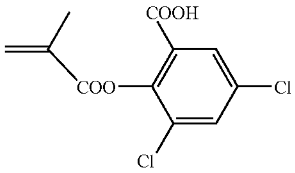
a-7
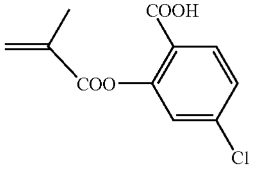
a-8
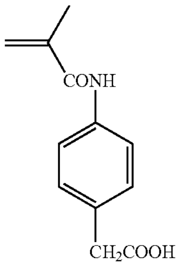
a-9
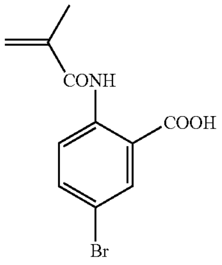
a-10
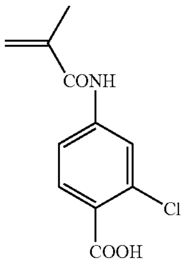
-continued
a-11
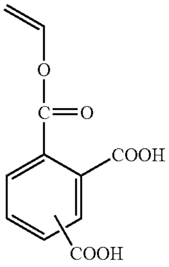
a-12
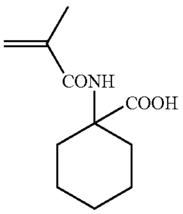
a-13
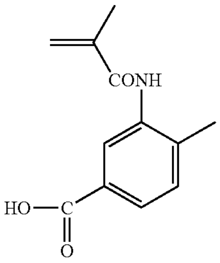
a-14, 15
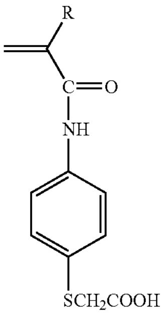
a-14: R = —H
a-15: R = —$CH_3$
a-16
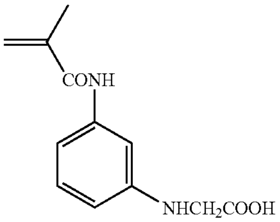
a-17
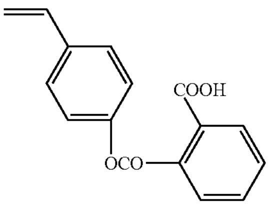

-continued a-18, 19, 20

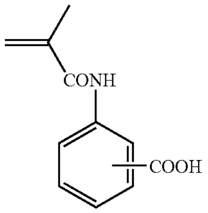

a-18:o-
a-19:m-
a-20:p-a-21

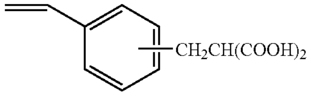

a-22, 23, 24

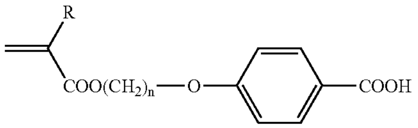

a-22:R = —$CH_3$, n = 4
a-23:R = —$CH_3$, n = 6
a-24:R = —H, n = 6 a-25

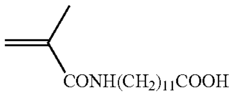

a-26

a-27

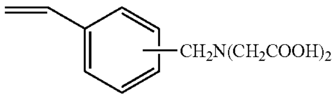

a-28

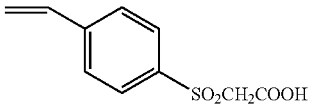

a-29

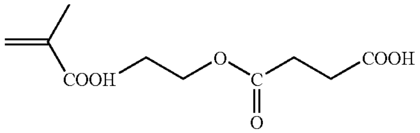

a-30

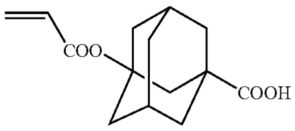

a-31

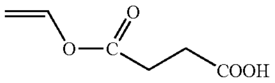

a-32

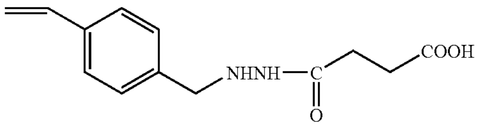

-continued a-33

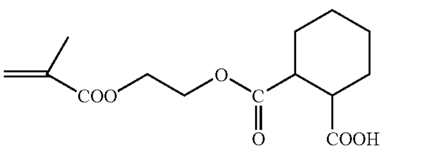

a-34

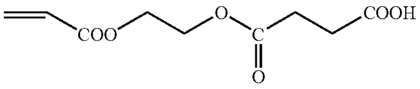

a-35

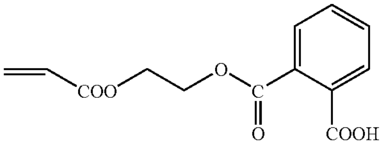

a-36

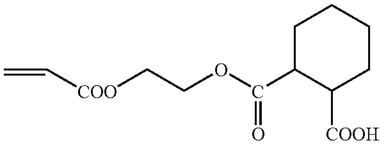

The content of the monomer component represented by Formula (a) in the acrylic polymer (a) is preferably 1 to 90 mole %, more preferably 2 to 50 mole %, and still more preferably 5 to 30 mole %. Favorable developing efficiency and higher film retention ratio in unexposed area can be obtained in the range above.

Examples of the acrylic monomer components that form copolymers (acrylic polymer (a)) by copolymerization with the monomer component represented by Formula (a) include (meth)acrylic esters and (meth)acrylamide derivatives. The copolymerization monomer component may be a compound selected from (meth)acrylic esters and (meth)acrylamide derivatives, or a combination of any two, three or more compounds selected therefrom. That is, the copolymerization monomer component may be, for example, a mixture of a total of four compounds, two selected from (meth)acrylic esters and two selected from (meth)acrylamide derivatives.

The (meth)acrylic ester for the copolymerization monomer component of acrylic polymer (a) is preferably a substituted or unsubstituted alkyl or aryl ester, or the like. Examples of the alkyl groups of the alkyl esters include a methyl group, ethyl group, n-propyl group, isopropyl group, n-butyl group, isobutyl group, t-butyl group, n-hexyl group, n-heptyl group, n-octyl group, 2-ethylhexyl group, and the like. In addition, examples of the aryl groups of the aryl esters include a phenyl group, 1-naphthyl group, 2-naphthyl group, benzyl group, and the like. The alkyl or aryl group may be substituted, and the substituent groups that can be introduced therein include a hydroxyl group, alkoxy group, halogen atom, phenyl group, dimethylamino group, ethylene oxide group, vinyl group, o-carboxybenzoyloxy group, and the like.

The (meth)acrylic esters above preferably include at least one of methyl acrylate, methyl methacrylate, ethyl methacrylate, isopropyl methacrylate, and n-butyl methacrylate.

In addition, the (meth)acrylic esters for use in the invention may be used alone or in combination of two or more.

The content of the (meth)acrylic ester in acrylic polymer (a) is preferably 0 to 95 mole %, more preferably 5 to 90 mole %, and still more preferably 10 to 80 mole %.

The (meth)acrylamide derivative suitable as the copolymerization monomer component for acrylic polymer (a) is not particularly restricted if it is the derivative of (meth) acrylamide, but is preferably a compound represented by the following Formula (b).

Formula (b)

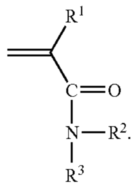

In Formula (b), $R^1$ represents a hydrogen atom or an alkyl group. $R^2$ and $R^3$ each independently represent a hydrogen atom, an alkyl group having 1 to 10 carbons, or an aryl group having 6 to 10 carbons. However, $R^2$ and $R^3$ are not hydrogen atoms at the same time.

In Formula (b), $R^1$ represents a hydrogen atom or an alkyl group. $R^1$ is preferably a hydrogen atom or an alkyl group having 1 to 4 carbons.

In Formula (b), the alkyl groups having 1 to 10 carbons represented by $R^2$ and $R^3$ include, for example, a methyl group, ethyl group, n-propyl group, n-butyl group, isobutyl group, t-butyl group, n-hexyl group, n-heptyl group, n-octyl group, 2-ethylhexyl group, and the like. The aryl groups having 6 to 10 carbons include, for example, a phenyl group, 1-naphthyl group, 2-naphthyl group, and the like. The alkyl or aryl group may be substituted, and the substituent groups that can be introduced include a hydroxyl group, alkoxy group, halogen atom, phenyl group, dimethylamino group, ethylene oxide group, vinyl group, o-carboxybenzoyloxy group, and the like. However, $R^2$ and $R^3$ are not hydrogen atoms at the same time.

Typical examples of the (meth)acrylamide derivatives will be described below, but the invention is not restricted thereto.

(b-1) N-t-Butyl acrylamide (b-2) N-(n-Butoxymethyl)acrylamide (b-3) N-t-Butyl methacrylamide (b-4) N-(1,1-Dimethyl-3-oxobutyl)acrylamide (b-5) N,N-Dimethyl methacrylamide (b-6) N,N-Dimethyl acrylamide (b-7) N-Isopropyl acrylamide (b-8) N-Methyl methacrylamide (b-9) N-Phenyl methacrylamide (b-10) N-[3-(Dimethylamino)propyl]acrylamide The (meth)acrylamide derivatives may be used alone or in combination of two or more as the copolymerization monomer component.

The content of the (meth)acrylamide derivative in acrylic polymer (a) is preferably 0 to 95 mole %, more preferably 5 to 90 mole %, and still more preferably 20 to 80 mole %.

The acrylic polymer (a) may contain any one of styrene derivatives as the copolymerization monomer component. The styrene derivative as the copolymerization monomer component is not particularly restricted if it is a styrene derivative, but the styrene derivatives represented by the following Formula (c) are preferred.

Formula (c)

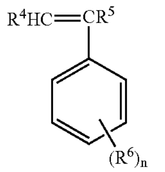

In Formula (c), $R^4$, $R^5$ and $R^6$ each independently represent a hydrogen atom or a substituent group. n is an integer of 1 to 5.

In Formula (c), the substituent groups represented by $R^4$, $R^5$ and $R^6$ are not particularly restricted, and examples thereof include an alkyl group, aryl group, hydroxyl group, carboxyl group, halogen atom, and the like.

Typical examples of the styrene derivatives are listed below, but the invention is not restricted thereto.

(c-1) 4-Bromostyrene (c-2) β-Bromostyrene (c-3) 4-Chloro-α-methylstyrene (c-4) 3-Chlorostyrene (c-5) 4-Chlorostyrene (c-6) 2,6-Dichlorostyrene (d-7) 2-Fluorostyrene (c-8) 3-Fluorostyrene (c-9) 4-Fluorostyrene (c-10) Methylstyrene (c-11) Vinyltoluene (c-12) trans-β-Methylstyrene c-13

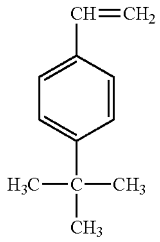

c-14

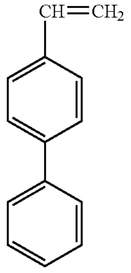

c-15

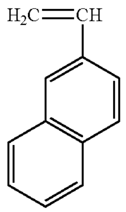

-continued c-16

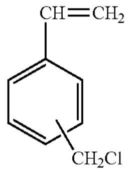

c-17

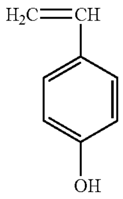

In addition to the compounds above, examples thereof include styrene, vinylbenzoic acid, methyl vinylbenzoate, hydroxymethylstyrene, p-styrenesulfonic acid sodium salt, p-styrenesulfinic acid potassium salt, p-aminomethylstyrene, 1,4-divinylbenzene, and the like. The styrene derivatives described above may be used alone or in combination of two or more.

The content of the styrene derivative in acrylic polymer (a) is preferably 0 to 95 mole %, more preferably 5 to 90 mole %, and still more preferably 20 to 80 mole %.

The copolymer obtained from the monomer component represented by Formula (a) above and the aforementioned copolymerization monomer component provides preferred physical properties, for example, a preferred development latitude, by themselves. However, further copolymerization with a third copolymerization monomer component can improve and modify various other physical properties. Examples of the various physical properties which can be improved or modified include chemical resistance, printing durability, sensitivity, printing efficiency, and the like. Examples of the third copolymerization monomer components include acrylonitrile, maleimide, vinyl acetate, N-vinyl-pyrrolidone, and the like.

The weight average molecular weight of the acrylic polymer (a) is preferably 5,000 to 200,000, more preferably 10,000 to 120,000, and particularly preferably 20,000 to 80,000, from the viewpoints of efficiency in film coating and developability. Examples of the method of producing the acrylic polymer (a) by copolymerization include hitherto known graft copolymerization method, block copolymerization method, random copolymerization method, and the like.

The acrylic polymer (a) is contained in the specific aqueous alkaline solution-soluble resin at a concentration in the range of 10 to 70 wt %.

The acrylic polymers (a) may be used alone or in combination of two or more in the specific aqueous alkaline solution-soluble resin.

Alternatively, the acrylic polymer (a) may be used in combination with another acrylic polymer such as the acrylic polymer (b) described below.

<<(b) Alkali-Soluble Polymer Compound Having a Sulfonamide Group>>

Hereinafter, an alkali-soluble polymer compound having a sulfonamide group (b) (hereinafter, referred to as "acrylic polymer (b)") will be described.

The acrylic polymer (b) can be obtained by homopolymerizing or copolymerizing monomer(s) having a sulfonamide group. Examples of the monomer having a sulfonamide group include a low-molecular weight monomer having in a molecule: one or more sulfonamide groups with at least one hydrogen atom being connected to the nitrogen atom thereof; and one or more polymerizable unsaturated bond. Among these examples, low-molecular weight compounds having an acryloyl group, allyl group, or vinyloxy group and a mono- or di-substituted aminosulfonyl group or a substituted sufonylimino group are preferable.

Among them, preferable examples of the monomers having a sulfonamide group are monomers represented by the following Formulae 1 to 5.

Formula 1

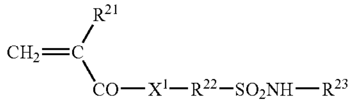

Formula 2

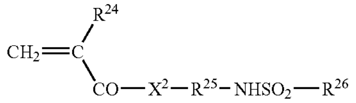

Formula 3

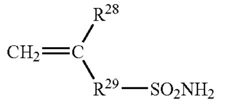

Formula 4

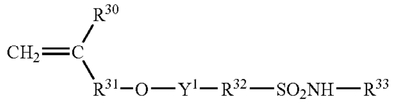

Formula 5

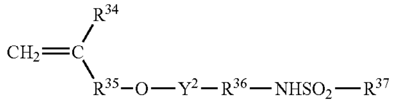

More specifically, m-aminosulfonylphenyl methacrylate, N-(p-aminosulfonylphenyl) methacrylamide, N-(p-aminosulfonylphenyl) acrylamide, and the like may be favorably used.

Methods for producing the acrylic polymer (b) by copolymerization include hitherto known graft copolymerization method, block copolymerization method, random copolymerization method, and the like.

Acrylic monomers contained in the acrylic polymer (b) as the copolymerization component include, for example, monomers (1) to (5) listed below:

(1) Acrylic and methacrylic esters having an aliphatic hydroxyl group such as 2-hydroxyethyl acrylate and 2-hydroxyethyl methacrylate;

(2) Alkyl acrylates such as methyl acrylate, ethyl acrylate, propyl acrylate, butyl acrylate, amyl acrylate, hexyl acrylate, octyl acrylate, benzyl acrylate, 2-chloroethyl acrylate, glycidyl acrylate, and N-dimethylaminoethyl acrylate;

(3) Alkyl methacrylates such as methyl methacrylate, ethyl methacrylate, propyl methacrylate, butyl methacrylate, amyl methacrylate, hexyl methacrylate, cyclohexyl methacrylate, benzyl methacrylate, 2-chloroethyl methacrylate, glycidyl methacrylate, and N-dimethylaminoethyl methacrylate;

(4) Acrylamides or methacrylamides such as acrylamide, methacrylamide, N-methylol-acrylamide, N-ethyl-acrylamide, N-hexyl-methacrylamide, N-cyclohexyl-acrylamide, N-hydroxyethyl-acrylamide, N-phenyl-acrylamide, N-nitrophenyl-acrylamide, and N-ethyl-N-phenyl-acrylamide;

(5) Unsaturated imides such as maleimide, N-acryloyl-acrylamide, N-acetyl-methacrylamide, N-propionyl-methacrylamide, and N-(p-chlorobenzoyl)-methacrylamide; and (6) Vinyl ethers such as ethylvinylether, 2-chloroethylvinylether, hydroxyethylvinylether, propylvinylether, butylvinylether, octylvinylether, and phenylvinylether.

The acrylic polymer (b) may be prepared from the acrylic monomer above and another polymerizable monomer by copolymerization. In regard to the copolymerization ratio, the acrylic monomer is preferably contained at a content of 10 mole % or more, and more preferably 20 mole % or more, from the viewpoints of solubility in alkaline developer and others.

The other usable polymerizable monomers are, for example, monomers (m1) to (m6) listed below, but the invention is not restricted thereto:

(m1) Vinyl esters such as vinyl acetate, vinyl chloroacetate, vinyl butyrate, and vinyl benzoate;

(m2) Styrenes such as styrene, α-methylstyrene, methylstyrene, and chloromethylstyrene;

(m3) Vinylketones such as methylvinylketone, ethylvinylketone, propylvinylketone, and phenylvinylketone;

(m4) Olefins such as ethylene, propylene, isobutylene, butadiene, and isoprene;

(m5) N-Vinyl-pyrrolidone, N-vinyl-carbazole, 4-vinylpyridine, acrylonitrile, methacrylonitrile, and the like; and (m6) Unsaturated carboxylic acids such as maleic anhydride and itaconic acid.

The weight average molecular weight of the acrylic polymer (b) is preferably 2,000 or more, and the number-average molecular weight thereof is preferably 500 or more. Still more preferably, the weight average molecular weight is 5,000 to 300,000; the number-average molecular weight is 800 to 250,000; and the degree of dispersion (weight average molecular weight/number-average molecular weight) is 1.1 to 10.

The acrylic polymer (b) is contained in the specific aqueous alkaline solution-soluble resin at a concentration in the range of 10 to 70 wt %.

The acrylic polymers (b) may be used alone or in combination of two or more in the specific aqueous alkaline solution-soluble resin.

It may also be used in combination with another acrylic polymer such as acrylic polymer (a).

(Aqueous Alkaline Solution-Soluble Resin Used Together With Acrylic Polymer)

Any publicly known resins may be used unlimitedly as the aqueous alkaline solution-soluble resin used together with an acrylic polymer such as acrylic polymer (a) or (b) in the specific aqueous alkaline solution-soluble resin. In particular, polymer compounds having a phenolic hydroxyl group are favorable. Hereinafter, typical examples thereof are listed, but the invention is not restricted thereto.

Examples of the polymer compounds having a phenolic hydroxyl group include phenol formaldehyde resins, m-cresol formaldehyde resins, p-cresol formaldehyde resins, mixed m-/p-cresol formaldehyde resins, xylenol formaldehyde resins, novolak resins such as phenol/cresol (either, m-, p-, or mixed m-/p-) mixed fromaldehyde resins, and pyrogallol acetone resins.

In addition to the resins above, the favorable polymer compounds having a phenolic hydroxyl group include polymer compounds having a phenolic hydroxyl group on the side chain. The polymer compounds having a phenolic hydroxyl group on the side chain include polymer compounds obtained by polymerizing a polymerizable low-molecular weight monomer compound having one or more phenolic hydroxyl groups and one or more polymerizable unsaturated bonds or copolymerizing the monomer and another polymerizable monomer.

Examples of the polymerizable monomers having a phenolic hydroxyl group include acrylamides having a phenolic hydroxyl group, methacrylamide, acrylic esters, methacrylic esters, hydroxystyrene, and the like. Specific preferable examples thereof include N-(2-hydroxyphenyl)-acrylamide, N-(3-hydroxyphenyl)-acrylamide, N-(4-hydroxyphenyl)-acrylamide, N-(2-hydroxyphenyl)-methacrylamide, N-(3-hydroxyphenyl)-methacrylamide, N-(4-hydroxyphenyl)-methacrylamide, o-hydroxyphenyl acrylate, m-hydroxyphenyl acrylate, p-hydroxyphenyl acrylate, o-hydroxyphenyl methacrylate, m-hydroxyphenyl methacrylate, p-hydroxyphenyl methacrylate, o-hydroxystyrene, m-hydroxystyrene, p-hydroxystyrene, 2-(2-hydroxyphenyl)ethyl acrylate, 2-(3-hydroxyphenyl)ethyl acrylate, 2-(4-hydroxyphenyl)ethyl acrylate, 2-(2-hydroxyphenyl)ethyl methacrylate, 2-(3-hydroxyphenyl)ethyl methacrylate, 2-(4-hydroxyphenyl)ethyl methacrylate, and the like.

The monomers having a phenolic hydroxyl group that may be copolymerized with the polymerizable monomer include monomers exemplified in (1) to (6), and (m1) to (m6) above.

The polymer compounds having a phenolic hydroxyl group may be used in combination of two or more. In addition, the polymer compound may be used together with a phenol formaldehyde condensation polymer such as a t-butylphenol formaldehyde resin or an octylphenol formaldehyde resin described in U.S. Pat. No. 4,123,279, which contain an alkyl group having 3 to 8 carbons as the substituent group.

Further, the aqueous alkaline solution-soluble resins which may be used combinedly include polymer compounds obtained by polymerizing two or more among the polymerizable monomers having a sulfonamide group, the polymerizable monomers having a phenolic hydroxyl group, and polymerizable monomers having an active imide group; and polymer compounds obtained by copolymerizing these two or more polymerizable monomers and another polymerizable monomer.

When the aqueous alkaline solution-soluble resin which may be used combinedly is a homopolymer or copolymer of the polymerizable monomer, the weight average molecular weight thereof is preferably 2,000 or more, and the number-average molecular weight thereof 500 or more. More preferably, the weight average molecular weight is 5,000 to 300,000; the number-average molecular weight, 800 to 250,000; and the molecular weight distribution (weight average molecular weight/number-average molecular weight), 1.1 to 10.

Further, when the aqueous alkaline solution-soluble resin which may be used combinedly is a resin such as a phenol formaldehyde resin, cresol aldehyde resin, or the like, the weight average molecular weight thereof is preferably 500 to 20,000, and the number-average molecular weight 200 to 10,000.

The content of the specific aqueous alkaline solution-soluble resin in the photosensitive layer of planographic printing plate precursor is preferably 5 to 40 wt % and more preferably 10 to 30 wt % with respect to the total solid matters in the photosensitive layer.

(Compound Generating Heat by Absorbing Light)

The photosensitive layer according to the invention contains a compound generating heat by absorbing light (photothermal conversion substance). The planographic printing plate precursor according to the invention becomes higher in sensitivity by containing the photothermal conversion substance.

Use of an infrared ray-absorbing dye as the photothermal conversion substance is preferably. The infrared ray-absorbing dyes favorably used in the invention include commercially available dyes and publicly known dyes described in literature (e.g., "Dye manual", the Society of Synthetic Organic Chemistry, Japan Ed., 1970). Specific examples thereof include azo dyes, metal complex salt azo dyes, pyrazolone azo dyes, anthraquinone dyes, phthalocyanine dyes, carbonium dyes, quinonimine dyes, methine dyes, cyanine dyes and the like. Among these dyes, dyes absorbing an infrared light at a wavelength of 700 to 1,200 nm are particularly preferable in the invention, as they are suitable for use together with a laser having a wavelength in the infrared light or near-infrared region.

Typical examples of these infrared ray-absorbing dyes include cyanine dyes described in JP-A Nos. 58-125246, 59-84356, and 60-78787, U.S. Pat. No. 4,973,572, and others; methine dyes described in JP-A Nos. 58-173696, 58-181690, and 58-194595, and others; naphthoquinone dyes described in JP-A Nos. 58-112793, 58-224793, 59-48187, 59-73996, 60-52940, and 60-63744, and others; squalelium dyes described in JP-A No. 58-112792 and others; cyanine dye described in U.K. Patent No. 434,875; and the like.

Preferable examples of the dyes include infrared-absorbing sensitizers described in U.S. Pat. No. 5,156,938; arylbenzo(thio)pyrylium salts described in U.S. Pat. No. 3,881,924; trimethine thiapyrylium salts described in JP-A No. 57-142645; pyrylium compounds described in JP-A Nos. 58-181051, 58-220143, 59-41363, 59-84248, 59-84249, 59-146063, and 59-146061; cyanine dyes described in JP-A No. 59-216146; pentamethine thiopyrylium salts and the like described in U.S. Pat. No. 4,283,475; pyrylium compounds and the like described in Jan. Examined Patent Publication Nos. 5-13514 and 5-19702; commercial products such as Epolight III-178, Epolight III-130, and Epolight III-125 manufactured by Epolin, Inc.; and the like.

Other preferable examples thereof include infrared-absorbing dyes represented by Formulae (I) and (II) described in U.S. Pat. No. 4,756,993.

The content of the infrared ray-absorbing dye is 0.01 to 30 wt %, preferably 0.1 to 30 wt %, and still more preferably 0.2 to 25 wt % with respect to the total solid matters in the photosensitive layer, from the viewpoints of sensitivity and durability.

(Insolubilizing Compound)

The planographic printing plate precursor according to the invention may contain various insolubilizing compounds (solubilization inhibitors) in the photosensitive layer, for the purpose of making the photosensitive layer less soluble in the developer (solubilization inhibition).

Any one of publicly known inhibitors may be used without particular restriction in the invention. Among them, quaternary ammonium salts, polyethylene glycol compounds and the like are particularly favorable.

The quaternary ammonium salt is not limited to specific kinds, and examples thereof include tetraalkylammonium, trialkylarylammonium, dialkyldiarylammonium, alkyltriarylammonium, tetaraarylammonium, cyclic ammonium, and bicyclic ammonium salts, and ammonium salts described in Japanese Patent Applications Nos. 2002-229186, and 2001-398047.

Specific examples thereof include tetrabutylammonium bromide, tetrapentylammonium bromide, tetrahexylammonium bromide, tetraoctylammonium bromide, tetralaurylammonium bromide, tetraphenylammonium bromide, tetranaphthylammonium bromide, tetrabutylammonium chloride, tetrabutylammonium iodide, tetrastearylammonium bromide, lauryltrimethylammonium bromide, stearyltrimethylammonium bromide, behenyltrimethylammonium bromide, lauyrltriethylammonium bromide, phenyltrimethylammonium bromide, 3-trifluoromethylphenyltrimethylammonium bromide, benzyltrimethylammonium bromide, dibenzyldimethylammonium bromide, distearyldimethylammonium bromide, tristearylmethylammonium bromide, benzyltriethylammonium bromide, hydroxyphenyltrimethylammonium bromide, and N-methylpyridinium bromide.

The amount of the (solid) quaternary ammonium salt to be added is preferably from 0.1 to 50% by mass, more preferably from 1 to 30% by mass of all solid contents of the photosensitive layer. When the amount of the quaternary ammonium is 0.1% by mass or less, the dissolution-suppressing effect of the salt is reduced, which is not preferable. When the amount of the quaternary ammonium is 50% by more, the film-forming properties of the binder may be adversely affected.

The polyethylene glycol type compound is not limited to specific kinds, and may be a compound having a structure represented by the following general formula (I):

$$R^1—\{—O—(R^3—O—)_m—R^2\}_n \qquad (I)$$

wherein $R^1$ represents a polyhydric alcohol residue or polyhydric phenol residue; $R^2$ represents a hydrogen atom, or an alkyl, alkenyl, alkynyl, alkyloyl, aryl or aryloyl group which may each have a substituent and each have 1 to 25 carbon atoms; $R^3$ represents an alkylene group which may have a substituent; m and n are an integer of 10 or more and an integer of 1 or more and 4 or less, respectively, on average.

Examples of the polyethylene glycol type compound represented by the general formula (I) include polyethylene glycols, polypropylene glycols, polyethylene glycol alkyl ethers, polypropylene glycol alkyl ethers, polyethylene glycol aryl ethers, polypropylene glycol aryl ethers, polyethylene glycol alkylaryl ethers, polypropylene glycol alkylaryl ethers, polyethylene glycol glycerin esters, polypropylene glycol glycerin esters, polyethylene sorbitol esters, polypropylene glycol sorbitol esters, polyethylene glycol aliphatic acid esters, polypropylene glycol aliphatic acid esters, polyethylene glycolized ethylenediamines, polypropylene glycolized ethylenediamines, polyethylene glycolized diethylenetriamine, and polypropylene glycolized diethylenetriamines.

Specific examples thereof include polyethylene glycol 1000, polyethylene glycol 2000, polyethylene glycol 4000, polyethylene glycol 10000, polyethylene glycol 20000, polyethylene glycol 5000, polyethylene glycol 100000, polyethylene glycol 200000, polyethylene glycol 500000, polypropylene glycol 1500, polypropylene glycol 3000, polypropylene glycol 4000, polyethylene glycol methyl ether, polyethylene glycol ethyl ether, polyethylene glycol phenyl ether, polyethylene glycol dimethyl ether, polyethylene glycol diethyl ether, polyethylene glycol diphenyl ether, polyethylene glycol lauryl ether, polyethylene glycol dilauryl ether, polyethylene glycol nonyl ether, polyethylene glycol cetyl ether, polyethylene glycol stearyl ether, polyethylene glycol distearyl ether, polyethylene glycol behenyl ether, polyethylene glycol dibehenyl ether, polypropylene glycol methyl ether, polypropylene glycol ethyl ether, polypropylene glycol phenyl ether, polypropylene glycol dimethyl ether, polypropylene glycol diethyl ether, polypropylene glycol diphenyl ether, polypropylene glycol lauryl ether, polypropylene glycol dilauryl ether, polypropylene glycol nonyl ether, polyethylene glycol acetyl ester, polyethylene glycol diacetyl ester, polyethylene glycol benzoic acid ester, polyethylene glycol lauryl ester, polyethylene glycol dilauryl ester, polyethylene glycol nonylic acid, polyethylene glycol cetylic acid ester, polyethylene glycol stearoyl ester, polyethylene glycol distearoyl ester, polyethylene glycol behenic acid ester, polyethylene glycol dibehenic acid ester, polypropylene glycol acetyl ester, polypropylene glycol diacetyl ester, polypropylene glycol benzoic acid ester, polypropylene glycol dibenzoic acid ester, polypropylene glycol lauric acid ester, polypropylene glycol dilauric acid ester, polypropylene glycol nonylic acid ester, polyethylene glycol glycerin ether, polypropylene glycol glycerin ether, polyethylene glycol sorbitol ether, polypropylene glycol sorbitol ether, polyethylene glycolized ethylenediamine, polypropylene glycolized ethylendiamine, polyethylene glycolized diethylenetriamine, polypropylene glycolized diethylenetriamine, and polyethylene glycolized pentamethylenehexamine.

In the case that such manners for making the inhibition (i.e., dissolution inhibiting power) high are adopted, the sensitivity of the recording layer lowers. In this case, it is effective, in order to prevent the sensitivity from becoming low, to add a lactone compound to the composition. It appears that when developer penetrates into exposed portions of the recording layer, that is, areas thereof where the inhibition has been cancelled, this lactone compound reacts with the developer to generate a new carboxylic acid compound, whereby the dissolution of the exposed areas of the recording layer is promoted to improve the sensitivity.

Such a lactone compound is not limited to specific kinds. Examples thereof include compounds by the following general formulae (L-1) and (L-II):

General formula (L-I)

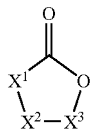

General formula (L-II)

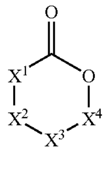

In the general formulae (L-I) and (L-II), $X^1$, $X^2$, $X^3$ and $X^4$ may be the same or different, and each represent a bivalent nonmetallic atom or nonmetallic atomic group which constitutes a part of the ring. These may each independently have a substituent. It is preferable that at least one of $X^1$, $X^2$ and $X^3$ in the general formula (L-I), and at least one of $X^1$, $X^2$, $X^3$ and $X^4$ in the general formula (L-II) each have an electron withdrawing substituent or a substituent substituted with an electron withdrawing group.

The constituent atom or atomic group of the rings represented by $X^1$, $X^2$, $X^3$ or $X^4$ is a nonmetal atom or an atomic group having the nonmetal atom that has two single bonds for forming the ring.

The nonmetallic atom or nonmetallic atomic group is preferably an atom or atomic group selected from methylene, sulfinyl, carbonyl, thiocarbonyl, and sulfonyl groups, and sulfur, oxygen and selenium atoms, and is more preferably an atomic group selected from methylene, carbonyl and sulfonyl groups.

At least one of $X^1$, $X^2$ and $X^3$ in the general formula (L-I) or at least one of $X^1$, $X^2$, $X^3$ and $X^4$ in the general formula (L-II) has an electron withdrawing group. The electron withdrawing substituent (or group) referred to in the invention means a group having a positive Hammett substituent constant σp. About the Hammett substituent constant, the following can be referred to: Journal of Medicinal Chemistry, 1973, Vol. 16, No. 11, 1207–1216, and so on. Examples of the electron withdrawing group having a positive Hammett substituent constant σp include halogen atoms (such as a fluorine atom (σp value: 0.06), a chlorine atom (σp value: 0.23), a bromine atom (σp value: 0.23) and a iodine atom (σp value: 0.18)); trihaloalkyl groups (such as tribromomethyl (σp value: 0.29), trichloromethyl (σp value: 0.33), and trifluoromethyl (σp value: 0.54)); a cyano group (σp value: 0.66); a nitro group (σp value: 0.78); aliphatic, aryl or heterocyclic sulfonyl groups (such as methanesulfonyl (σp value: 0.72)); aliphatic, aryl or heterocyclic acyl groups (such as acetyl (σp value: 0.50) and benzoyl (σp value: 0.43)); alkynyl groups (such as C ≡CH (σp value: 0.23)); aliphatic, aryl or heterocyclic oxycarbonyl groups (such as methoxycarbonyl (σp value: 0.45) and phenoxycarbonyl (σp value: 0.44)); and a carbamoyl group (σp value: 0.36); a sulfamoyl group (σp value: 0.57); a sulfoxide group; heterocyclic groups; an oxo group; and a phosphoryl groups.

Preferable examples of the electron withdrawing group include an amide group, an azo group, a nitro group, fluoroalkyl groups having 1 to 5 carbon atoms, a nitrile group, alkoxycarbonyl groups having 1 to 5 carbon atoms, acyl groups having 1 to 5 carbon atoms, alkylsulfonyl groups having 1 to 9 carbon atoms, arylsulfonyl groups having 6 to 9 carbon atoms, alkylsulfinyl groups having 1 to 9 carbon atoms, arylsulfinyl groups having 6 to 9 carbon atoms, arylcarbonyl groups having 6 to 9 carbon atoms, thiocarbonyl groups, fluorine-containing alkyl groups having 1 to 9 carbon atoms, fluorine-containing aryl groups having 6 to 9 carbon atoms, fluorine-containing allyl groups having 3 to 9 carbon atoms, an oxo group, and halogen atoms. More preferable examples of the electron withdrawing group include a nitro group, fluoroalkyl groups having 1 to 5 carbon atoms, a nitrile group, alkoxycarbonyl groups having 1 to 5 carbon atoms, acyl groups having 1 to 5 carbon atoms, arylsulfonyl groups having 6 to 9 carbon atoms, arylcarbonyl groups having 6 to 9 carbon atoms, an oxo group, and halogen atoms.

Specific examples of the compounds represented by the general formulae (L-I) and (L-II) are illustrated below. In the invention, however, the compounds are not limited to these compounds.

(LI-1)

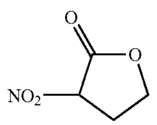

-continued
(LI-2)
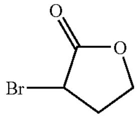
(LI-3)
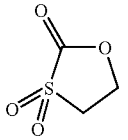
(LI-4)
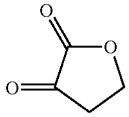
(LI-5)
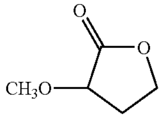
(LI-6)
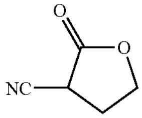
(LI-7)
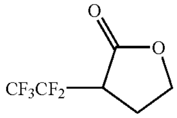
(LI-8)
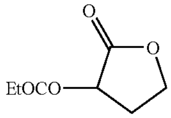
(LI-9)
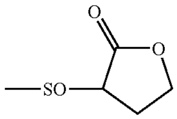
(LI-10)
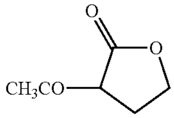
(LI-11)
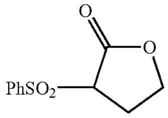
(LI-12)
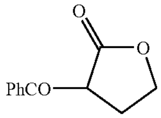
-continued
(LI-13)
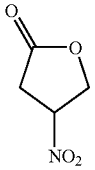
(LI-14)
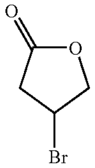
(LI-15)
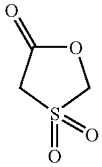
(LI-16)
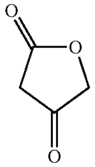
(LI-17)
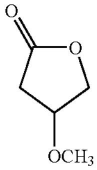
(LI-18)
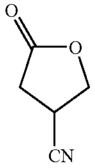
(LI-19)
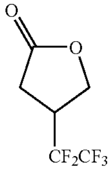
(LI-20)
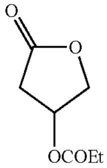
(LI-21)
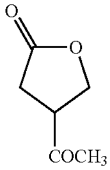

-continued (LI-22)

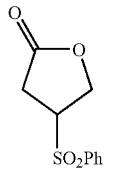

(LI-23)

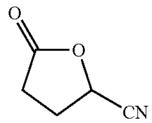

(LI-24)

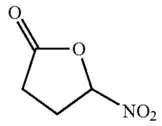

(LII-1)

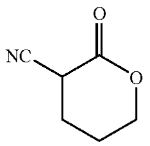

(LII-2)

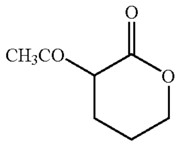

The (solid) amounts to be added, of the compounds represented by the general formulae (L-I) and (L-II), is preferably from 0.1 to 50% by mass, more preferably from 1 to 30% by mass of all solid contents of the photosensitive layer, from the viewpoints of the solubility-suppressing effect and the image-forming properties of the recording layer. It is preferable that these compounds are selectively brought into contact with the developer, because these compounds are reacted with the developer.

The lactone compounds in the invention may be used alone or in combination of two or more thereof. In the case of using two or more types of the compounds represented by the general formula (L-I) or two or more types of the compounds represented by the general formula (L-II), the ratio between the added amounts of the these compounds may be arbitrary set if the total added amount of the compounds is within the above-mentioned range.

Further, it is preferable that the planographic printing plate precursor according to the invention contains a substance that is thermally decomposable but substantially decreases the solubility of the alkali-soluble resin when it has not been thermally discomposed, for further increasing the difference between the exposed and unexposed areas.

The type of the "substance that is thermally decomposable but substantially decreases the solubility of the alkali-soluble resin when it has not been thermally discomposed" is not particularly restricted, and examples thereof include various onium salts, quinone diazide compounds, and the like. In particular, an onium salt is preferable due to its thermal decomposability.

Examples of the onium salts used in the invention include diazonium salts, ammonium salts, phosphonium salts, iodonium salts, sulfonium salts, selenonium salts, and arseninum salts.

Particularly preferable examples thereof include diazonium salts described in S. I. Schlesinger, Photogr. Sci. Eng., 18, 387 (1974), T. S. Bal et al., Polymer, 21, 423 (1980), and JP-A No. 5-158230; ammonium salts described in U.S. Pat. Nos. 4,069,055 and 4,069,056, and JP-A No. 3-140140; phosphonium salts described in D. C. Necker et al, Macromolecules, 17, 2468 (1984), C. S. Wen et al., The, Proc. Conf. Rad. Curing ASIA p. 478, Tokyo, Oct. (1988), and U.S. Pat. Nos. 4,069,055 and 4,069,056; iodonium salts described in J. V. Crivello et al., Macromolecules, 10(6), 1307 (1977), Chem. & Eng. News, Nov. 28, p. 31 (1988), EP No. 104,143, U.S. Pat. No. 5,041,358, EP No. 4,491,628, and JP-A Nos. 2-150848 and 2-296514; sulfonium salts described in J. V. Crivello et al., Polymer J. 17, 73 (1985), J. V. Crivello et al., J. Org. Chem., 43, 3055 (1978), W. R. Watt et al., J. Polymer Sci., Polymer Chem. Ed., 22, 1789 (1984), J. V. Crivello et al., Polymer Bull., 14, 279 (1985), J. V. Crivello et al., Macromolecules, 14 (5), 1141 (1981), J. V. Crivello et al., J. Polymer Sci., Polymer Chem. Ed., 17, 2877 (1979), EP Nos. 370,693, 233, 567, 297,443 and 297,442, U.S. Pat. Nos. 4,933,377, 3,902,114, 4,491,628, 4,760,013, 4,734,444 and 2,833,827, and DE Patents Nos. 2,904,626, 3,604,580, 3,604,581; selenonium salts described in J. V. Crivello et al., Macromolecules, 10 (6), 1307 (1977), J. V. Crivello et al., J. Polymer Sci., Polymer Chem. Ed., 17, 1047 (1979); and arsenonium slats described in C. S. Wen et al., The, Proc. Conf. Rad. Curing ASIA p. 478 Tokyo, Oct. (1988).

Of these onium salts, diazonium salts are particularly preferable. Particularly preferable examples of the diazonium salts include salts described in JP-A No. 5-158230.

Examples of the counter ion for the onium salt include tetrafluoroboric acid, hexafluorophosphoric acid, triisopropylnaphthalenesulfonic acid, 5-nitro-o-toluenesulfonic acid, 5-sulfosalicylic acid, 2,5-dimethylbenzenesulfonic acid, 2,4,6-trimethylbenzenesulfonic acid, 2-nitrobenzenesulfonic acid, 3-chlorobenzenesulfonic acid, 3-bromobenzenesulfonic acid, 2-fluorocaprylnaphthalenesulfonic acid, dodecylbenzenesulfonic acid, 1-naphthol-5-sulfonic acid, 2-methoxy-4-hydroxy-5-benzoyl-benzenesulfonic acid, and paratoluenesulfonic acid ions. Of these examples, alkylaromatic sulfonic acid ions are preferable, examples of which include hexafluorophosphoric acid, triisopropylnaphthalenesulfonic acid, and 2,5-dimethylbenzenesulfonic acid ions.

The added amount of the onium salt is preferably from 0.1 to 50% by mass, more preferably from 0.1 to 30% by mass, even more preferably from 0.3 to 30% by mass of all solid contents of the upper layer.

The quinonediazide compounds are preferably o-quinonediazide compounds. The o-quinonediazide compounds are compounds which each have at least one o-quinonediazide group and each have alkali-solubility increased by being thermally decomposed, and which may have various structures. In other words, the o-quinonediazide compounds assist the dissolution of the upper layer by both of the effect that the compounds are thermally decomposed so that their inhibition for the developing inhibitor is lost and the effect that the o-quinonediazide compounds themselves change to alkali-soluble substances.

Such an o-quinonediazide compound may be, for example, a compound described in J Cohser "Light-Sensitive Systems" (John & Wiley & Sons. Inc.), pp. 339–352. Particularly preferable is a sulfonic acid ester or sulfonamide of o-quinonediazide, which is obtained by reacting the o-quinonediazide with an aromatic polyhydroxy compound or aromatic amino compound. Preferable are also an ester made from benzoquinone-(1,2)-diazidesulfonic acid chloride or naphthoquinone-(1,2)-diazide-5-sulfonic acid chloride and pyrogallol-acetone resin, described in Japanese Patent Application Laid-Open (JP-B) No. 43-28403; an ester made from benzoquinone-(1,2)-diazidesulfonic acid chloride or naphthoquinone-(1,2)-diazide-5-sulfonic acid chloride and phenol-formaldehyde resin, described in U.S. Pat. Nos. 3,046,120 and 3,188,210.

Furthermore, preferable are an ester made from naphthoquinone-(1,2)-diazide-4-sulfonic acid chloride and phenol formaldehyde resin or cresol-formaldehyde resin, and an ester made from naphthoquinone-(1,2)-diazide-4-sulfonic acid chloride and pyrogallol-acetone resin. Other useful o-quinonediazide compounds are reported and disclosed in many examined or unexamined patent documents, for example, JP-A Nos. 47-5303, 48-63802, 48-63803, 48-96575, 49-38701 and 48-13354, JP-B Nos. 41-11222, 45-9610 and 49-17481, U.S. Pat. Nos. 2,797,213, 3,454,400, 3,544,323, 3,573,917, 3,674,495 and 3,785,825, GB Patents Nos. 1,227,602, 1,251,345, 1,267,005, 1,329,888 and 1,330,932, and DE Patent No. 854,890.

The added amount of the o-quinonediazide compound is preferably from 1 to 50% by mass, more preferably from 5 to 30% by mass, even more preferably from 10 to 30% by mass of all solid contents of the upper layer, in terms of the image-forming properties and durability of image portions of the recording layer. The above-mentioned o-quinonediazide compounds may be used alone or in a mixture form.

The thermally decomposable substance is more preferably an onium salt from the viewpoint of decomposability.

Use of the onium salt having relatively high thermal decomposability accelerates decomposition of the thermally decomposable substance in the exposed area and improves discrimination of the unexposed area from the exposed area.

In addition to the components above, various additives may be added as needed to the photosensitive layer in an amount that does not impair the advantageous effects of the invention. Hereinafter, examples of the additives will be described.

For example, a polymer composed of (meth)acrylate monomer as the polymerization component having, in the molecule, two or three C3 to C20 perfluoroalkyl groups described in JP-A No. 2000-187318 is preferably used in combination, for the purpose of increasing the distinctiveness (discrimination) between the image and the non-image portions and improving the resistance to surface abrasion.

The addition amount thereof is preferably 0.1 to 10 wt % and more preferably 0.5 to 5 wt % with respect to the total solid matters in the photosensitive layer.

Addition of a compound that decreases the static friction coefficient of surface is also preferable for the purpose of providing the planographic printing plate precursor with resistance to abrasion. Specific examples thereof include esters of long-chain alkylcarboxylic acids, which are used in U.S. Pat. No. 6,117,913 and others.

The photosensitive layer may additionally contain a low-molecular weight compound having an acidic group as needed. The acidic groups include sulfonic acid, carboxylic acid, and phosphoric acid groups. Among them, a compound having a sulfonic acid group is preferable. Specific examples thereof include aromatic sulfonic acids such as p-toluenesulfonic acid and naphthalenesulfonic acid, and aliphatic sulfonic acids.

The addition amount is preferably 0.05 to 5 wt % and more preferably 0.1 to 3 wt % with respect to the total solid matters in the photosensitive layer, from the viewpoint of the solubility of photosensitive layer in developer.

In the invention, the photosensitive layer may additionally contain various insolubilizing agents for control of the solubility. Disulfone or sulfone compounds shown in JP-A No. 11-119418 are favorably used as the insolubilizing agent, and a typical example thereof is 4,4'-bishydroxyphenylsulfone.

In addition, cyclic acid anhydrides, phenols, or organic acids may be used combinedly for further improvement in sensitivity. Examples of the cyclic acid anhydrides include phthalic anhydride, tetrahydrophthalic anhydride, hexahydrophthalic anhydride, 3,6-end-oxy-Δ4-tetrahydrophthalic anhydride, tetrachlorophthalic anhydride, maleic anhydride, chloromaleic anhydride, α-phenylmaleic anhydride, succinic anhydride, pyromellitic anhydride, and the like as described in U.S. Pat. No. 4,115,128. Examples of the phenols include, bisphenol A, p-nitrophenol, p-ethoxyphenol, 2,4,4'-trihydroxybenzophenone, 2,3,4-trihydroxybenzophenone, 4-hydroxybenzophenone, 4,4',4"-trihydroxytriphenylmethane, 4,4',3",4"-tetrahydroxy-3,5,3',5'-tetramethyltriphenylmethane, and the like.

Additionally, examples of the organic acids include the sulfonic acids, sulfinic acids, alkylsulfuric acids, phosphonic acids, phosphoric acid esters and carboxylic acids described in JP-A Nos. 60-88942 and 2-96755, and others, and specific examples thereof include p-toluenesulfonic acid, dodecylbenzenesulfonic acid, p-toluenesulfinic acid, ethylsulfuric acid, phenylphosphonic acid, phenylphosphinic acid, phenyl phosphate, diphenyl phosphate, benzoic acid, isophthalic acid, adipic acid, p-toluyl acid, 3,4-dimethoxybenzoic acid, phthalic acid, terephthalic acid, 4-cyclohexene-1,2-dicarboxylic acid, erucic acid, lauric acid, n-undecane acid, ascorbic acid, and the like.

The following may be added to the upper layer and/or the lower layer, which constitute(s) the recording layer related to the invention, in order to improve the applicability of a solution or solutions for forming the layer(s) or obtain the stability of developing treatment under wider developing conditions: a nonionic surfactant as described in JP-A Nos. 62-251740 and 3-208514; an amphoteric surfactant as described in JP-A Nos. 59-121044 and 4-13149; a siloxane compound as described in EP No. 950517; or a copolymer made from a fluorine-containing monomer, as described in JP-A No. 11-288093.

Specific examples of the nonionic surfactant include sorbitan tristearate, sorbitan monopalmitate, sorbitan trioleate, monoglyceride stearate, and polyoxyethylene nonyl phenyl ether. Specific examples of the amphoteric surfactant include alkyldi(aminoethyl)glycine, alkylpolyaminoethylglycine hydrochloride, 2-alkyl-N-carboxyethyl-N-hydroxyethylimidazolium betaine, and N-tetradecyl-N,N-betaine type surfactants (trade name: "Amorgen K", manufactured by Daiichi Kogyo Co., Ltd., and others).

The siloxane compound is preferably a block copolymer of dimethylsiloxane and polyalkylene oxide. Specific examples thereof include polyalkylene oxide modified silicones (trade names: DBE-224, DBE-621, DBE-712, DBP-732 and DBP-534 (trade name, manufactured by Chisso Corp.), and Tego Glide 100 (trade name, manufactured by Tego Co. in Germany)).

To the photosensitive layer, there may be added a printing-out agent for yielding a visible image immediately after the layer(s) is/are heated by exposure, or a dye or pigment as an image coloring agent.

A typical example of the printing-out agent is a combination of a compound which releases an acid by being heated by exposure to light (optically acid-releasing agent) with an organic dye which can form a salt. Specific examples thereof include combinations of o-naphthoquinonediazide-4-sulfonic acid halogenide with a salt-formable organic dye, described in JP-A Nos. 50-36209 and 53-8128; and combinations of a trihalomethyl compound with a salt-formable organic dye, described in JP-A Nos. 53-36223, 54-74728, 60-3626, 61-143748, 61-151644 and 63-58440. The trihalomethyl compound is an oxazole type compound or a triazine type compound. Either of these compounds are excellent in stability over time and can give vivid printed-out images.

The image coloring agent may be the above-mentioned salt-formable organic dye or some other dye than the salt-formable organic dye, and is preferably an oil-soluble dye or a basic dye. Specific examples thereof include Oil Yellow #101, Oil Yellow #103, Oil Pink #312, Oil Green BG, Oil Blue BOS, Oil Blue #603, Oil Black BY, Oil Black BS, and Oil Black T-505 (trade name, manufactured by Orient Chemical Industries Ltd.), Victoria Pure Blue, Crystal Violet Lactone, Crystal Violet (CI42555), Methyl Violet (CI42535), Ethyl Violet, Rhodamine B (CI145170B), Malachite Green (CI42000), and methylene Blue (CI52015). Dyes described in JP-A No. 62-293247 are particularly preferable.

A plasticizer may be added to the photosensitive layer of the present invention, in order to give flexibility and like to the coated layer(s). Examples of the plasticizer include butylphthalyl, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, and oligomer and polymer of acrylic acid or methacrylic acid.

(Formation of the Photosensitive Layer)

The photosensitive layer of the invention can be formed by dissolving the above-mentioned components in a solvent, to form a photosensitive layer coating solution, and then applying the coating solution onto an appropriate support.

Examples of the solvent used at this time include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetoamide, N,N-dimethylformaldehyde, tetramethylurea, N-methylpyrrolidone, dimethylsulfoxide, sulfolane, γ-butyrolactone and toluene. However, the solvent is not limited to these solvents. These solvents may be used alone or in a mixture form.

The concentration of the photosensitive layer coating solution prepared by using the solvent described above is preferably in a range of 1 to 50 wt %.

The solid content of the coating of the photosensitive layer may vary depending on the application, but is preferably in a range 0.5 to 3.0 $g/m^2$ in terms of the film properties and the sensitivities.

Examples of the method for coating a photosensitive layer on the support include various methods such as bar coater, spin, spray, curtain, dip, air knife, blade and roll coatings.

A surfactant, for example, a fluorochemical surfactant described in JP-A No. 62-170950, may be added to the photosensitive layer according to the invention for improvement of the coating property. The amount thereof to be added is preferably 0.01 to 1 wt % and more preferably 0.05 to 0.5 wt % with respect to the total solid substances in the layer.

In the planographic printing plate precursor according to the invention, the photosensitive layer prepared as described above may be a single layer, or alternatively, a two-layered laminate consisting of an upper layer and a lower layer.

If the two-layered laminate is formed, the layer closer to the support (lower layer) may be a layer that does not contain the photothermal conversion substance.

If the two-layer laminate is formed, the lower layer preferably contain none or a smaller amount of the monomer component represented by Formula (a) than the upper layer, from the viewpoints of development latitude and scratch resistance.

The amounts of the upper and lower layers coated (solid substance) when a two-layered laminate is formed vary according to applications, but the amount of the upper layer coated is preferably 0.05 to 1.0 $g/m^2$ and that of lower layer 0.3 to 3.0 $g/m^2$. When the amount of the upper layer coated is less than 0.05 $g/m^2$, the image-forming property thereof may deteriorate, while if it is higher than 1.0 $g/m^2$, the sensitivity thereof may deteriorate. The total amount of the two layers coated is preferably 0.5 to 3.0 $g/m^2$, from the viewpoints of the properties and the sensitivity of film.

[Support]

The support which is used in each of the first and second planographic printing plate precursors of the invention may be any plate-form product that has necessary strength and endurance and is dimensionally stable. Examples thereof include a paper sheet; a paper sheet on which a plastic (such as polyethylene, polypropylene, or polystyrene) is laminated; a metal plate (such as an aluminum, zinc, or copper plate), a plastic film (such as a cellulose diacetate, cellulose triacetate, cellulose propionate, cellulose lactate, cellulose acetate lactate, cellulose nitrate, polyethylene terephthalate, polyethylene, polystyrene, polypropylene, polycarbonate, or polyvinyl acetal film); and a paper or plastic film on which a metal as described above is laminated or vapor-deposited.

Of these supports, a polyester film or an aluminum plate is preferable in the invention. An aluminum plate is particularly preferable since the plate is good in dimensional stability and relatively inexpensive. Preferable examples of the aluminum plate include a pure aluminum plate, and alloy plates comprising aluminum as the main component and a small amount of different elements. A plastic film on which aluminum is laminated or vapor-deposited may be used. Examples of the different elements contained in the aluminum alloy include silicon, iron, manganese, copper, magnesium, chromium, zinc, bismuth, nickel, and titanium. The content by percentage of the different elements in the alloy is at most 10% by mass.

In the invention, pure aluminum is particularly preferable. However, completely pure aluminum is not easily produced from the viewpoint of metallurgy technology. Thus, aluminum containing a trance amount of the different elements may be used.

As described above, the aluminum plate used in the invention, the composition of which is not specified, may be any aluminum plate that has been known or used hitherto. The thickness of the aluminum plate used in the invention is generally from about 0.1 to 0.6 mm, preferably from 0.15 to 0.4 mm, and more preferably from 0.2 to 0.3 mm.

Before the surface of the aluminum plate is roughened, the plate is subjected to degreasing treatment with a surfactant, an organic solvent, an aqueous alkaline solution or the like if desired, in order to remove rolling oil on the surface. The roughening treatment of the aluminum plate surface is performed by any one of various methods, for example, by a mechanically surface-roughening method, or a method of dissolving and roughening the surface electrochemically, or a method of dissolving the surface selectively in a chemical manner.

The mechanically surface-roughening method which can be used may be a known method, such as a ball polishing method, a brush polishing method, a blast polishing method or a buff polishing method. The electrochemically surface-roughening method may be a method of performing surface-roughening in a hydrochloric acid or nitric acid electrolyte by use of alternating current or direct current. As disclosed in JP-A No. 54-63902, a combination of the two may be used.

The aluminum plate the surface of which is roughened as described above is subjected to alkali-etching treatment and neutralizing treatment if necessary. Thereafter, the aluminum plate is subjected to anodizing treatment if desired, in order to improve the water holding ability or wear resistance of the surface. The electrolyte used in the anodizing treatment of the aluminum plate is any one selected from various electrolytes which can make a porous oxide film. There is generally used sulfuric acid, phosphoric acid, oxalic acid, chromic acid, or a mixed acid thereof. The concentration of the electrolyte may be appropriately decided dependently on the kind of the electrolyte.

Conditions for the anodizing treatment cannot be specified without reservation since the conditions vary dependently on the used electrolyte. The following conditions are generally suitable: an electrolyte concentration of 1 to 80% by mass, a solution temperature of 5 to 70° C., a current density of 5 to 60 A/dm$^2$, a voltage of 1 to 100 V, and an electrolyzing time of 10 seconds to 5 minutes. If the amount of the anodic oxide film is less than 1.0 g/m$^2$, the printing durability is insufficient or non-image areas of the planographic printing plate are easily injured so that the so-called "injury stains", resulting from ink adhering to injured portions at the time of printing, are easily generated.

If necessary, the aluminum surface is subjected to treatment for hydrophilicity after the anodizing treatment.

The treatment for hydrophilicity which can be used in the invention may be an alkali metal silicate (for example, aqueous sodium silicate solution) method, as disclosed in U.S. Pat. Nos. 2,714,066, 3,181,461, 3,280,734, and 3,902,734. In this method, the support is subjected to immersing treatment or electrolyzing treatment with aqueous sodium silicate solution. Besides, there may be used a method of treating the support with potassium fluorozirconate disclosed in JP-B No. 36-22063 or with polyvinyl phosphonic acid, as disclosed in U.S. Pat. Nos. 3,276,868, 4,153,461, and 4,689,272.

In the planographic printing plate precursor of the invention, having a support and a photosensitive layer formed thereon, an undercoat layer may be formed between the support and the recording layer if necessary.

As components for the undercoat layer, various organic compounds may be used. Examples thereof include carboxymethylcellulose, dextrin, gum arabic, phosphonic acids having an amino group such as 2-aminoethylphosphonic acid, organic phosphonic acids such as phenylphosphonic acid, naphthylphosphonic acid, alkylphosphonic acid, glycerophosphonic acid, methylenediphosphonic acid and ethylenediphosphonic acid, each of which may have a substituent, organic phosphoric acids such as phenylphosphoric acid, naphthylphosphoric acid, alkylphosphoric acid and glycerophosphoric acid, each of which may have a substituent, organic phosphinic acids such as phenylphosphinic acid, naphthylphosphinic acid, alkylphosphinic acid, and glycerophosphinic acid, each of which may have a substituent, amino acids such as glycine and β-alanine, and hydrochlorides of amines having a hydroxyl group, such as hydrochloride of triethanolamine. These may be used in a mixture form.

Also preferable is an undercoat layer containing at least one type of compound selected from the organic polymer compounds having the structural unit represented by the following formula.

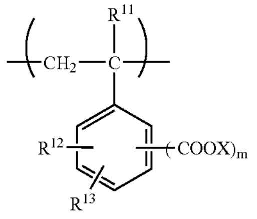

In the Formula, $R^{11}$ represents a hydrogen atom, a halogen atom or an alkyl group; $R^{12}$ and $R^{13}$ each independently represent a hydrogen atom, a hydroxyl group, a halogen atom, an alkyl group, a substituted alkyl group, an aryl group, a substituted aryl group, —$OR^{14}$, —$COOR^{15}$, —$CONHR^{16}$, —$COR^{17}$ or —CN, or form a ring by binding to each other; $R^{14}$ to $R^{17}$ each independently represent an alkyl group or an aryl group; X represents a hydrogen atom, a metal atom, or $NR^{18}R^{19}R^{20}R^{21}$; $R^{18}$ to $R^{21}$ each independently represent a hydrogen atom, an alkyl group, a substituted alkyl group, an aryl group, or a substituted aryl group, or form a ring by binding to each other; and m is an integer of 1 to 3.

This organic undercoat layer can be formed by the following method: a method of dissolving the above-mentioned organic compound into water, an organic solvent such as methanol, ethanol or methyl ethyl ketone, or a mixed solvent thereof to prepare a solution, applying the solution onto an aluminum plate, and drying the solution to form the undercoat layer; or a method of dissolving the above-mentioned organic compound into water, an organic solvent such as methanol, ethanol or methyl ethyl ketone, or a mixed solvent thereof to prepare a solution, dipping an aluminum plate into the solution to cause the plate to adsorb the organic compound, washing the plate with water or the like, and then drying the plate to form the undercoat layer.

In the former method, the solution of the organic compound having a concentration of 0.005 to 10% by mass can be applied by various methods. In the latter method, the concentration of the organic compound in the solution is from 0.01 to 20% by mass, preferably from 0.05 to 5% by mass, the dipping temperature is from 20 to 90° C., preferably from 25 to 50° C., and the dipping time is from 0.1 second to 20 minutes, preferably from 2 seconds to 1 minute.

The pH of the solution used in this method can be adjusted into the range of 1 to 12 with a basic material such as ammonia, triethylamine or potassium hydroxide, or an acidic material such as hydrochloric acid or phosphoric acid. A yellow dye can be added to the solution in order to improve the reproducibility of the tone of the image recording material.

The amount of the applied organic undercoat layer is suitably from 2 to 200 mg/m$^2$, preferably from 5 to 100

$mg/m^2$ from the viewpoint of the printing durability performance of the printing plate precursor.

(Plate-Making and Printing)

The planographic printing plate precursors prepared as described above are generally shipped, transported, and stored in the form that they are piled and packaged with an inserting paper inserted between two planographic printing plate precursors. In general, during plate-making and printing, a piled pair of the inserting paper and the original plate is held, conveyed, supplied, and fixed to the site where the plate-making is performed by an autoloader, and then the inserting paper is removed, but the mode of the plate-making and printing is not limited thereto.

After removal of the inserting paper, an image is exposed to and developed on the original plate.

The light source for the active light used for image exposure is preferably a light source having an emission wavelength in the near-infrared to infrared region, and the method of exposure may be either a scanning method or a face-exposure method, but exposure by a scanning method by using a solid-state or semiconductor laser is preferable. The emission wavelength is preferably in the range of 760 to 1,080 nm.

The developer which can be used in developing treatment of the first and second planographic printing plate precursors of the invention is a developer having a pH of 9.0 to 14.0, preferably 12.0 to 13.5. The developer, the category of which includes not only developer but also replenisher hereinafter, may be an aqueous alkaline solution that has been known so far. Examples thereof include aqueous solutions of inorganic alkali salts such as sodium silicate, potassium silicate, sodium triphosphate, potassium triphosphate, ammonium triphosphate, sodium biphosphate, potassium biphosphate, ammonium biphosphate, sodium carbonate, potassium carbonate, ammonium carbonate, sodium hydrogencarbonate, potassium hydrogencarbonate, ammonium hydrogencarbonate, sodium borate, potassium borate, ammonium borate, sodium hydroxide, ammonium hydroxide, potassium hydroxide and lithium hydroxide; and organic alkali agents such as monomethylamine, dimethylamine, trimethylamine, monoethylamine, diethylamine, triethylamine, monoisopropylamine, diisopropylamine, ethyleneimine, ethylenediamine, and pyridine. These aqueous alkaline soltuions may be used alone or in combination of two or more thereof.

Of the above-mentioned aqueous alkaline solutions, one preferable developer, which exhibits the effects of the invention effectively, is an aqueous solution having a pH of 12 or more and comprising alkali silicate as a base or alkali silicate obtained by mixing a base with a silicon compound. The aqueous solution is the so-called "silicate developer". Another preferable developer is the so-called "non-silicate developer", which does not comprise any alkali silicate but comprises a nonreducing sugar (organic compound having a buffer effect) and a base.

About the former, the developing power of aqueous solution of alkali metal silicate can be adjusted by adjusting the ratio between silicon oxide $SiO_2$ and alkali metal oxide $M_2O$, which are components of the silicate, (generally, the mole ratio of $[SiO_2]/[M_2O]$), and the concentration of the alkali metal silicate. For example, the following is preferably used: an aqueous solution of sodium silicate wherein the mole ratio of $SiO_2/Na_2O$ ($[SiO_2]/[Na_2O]$) is from 1.0 to 1.5 and the content by percentage of $SiO_2$ is from 1 to 4% by mass, as disclosed in JP-A No. 54-62004; or an aqueous solution of alkali metal silicate wherein the mole ratio of $SiO_2/M$ is from 0.5 to 0.75 (that is, the mole ratio of $SiO_2/M_2O$ is from 1.0 to 1.5), the content by percentage of $SiO_2$ is from 1 to 4% by mass, and the content by percentage of potassium in all alkali metals is 20% by gram atom, as disclosed in JP-B No. 57-7427.

The so-called "non-silicate developer", which does not comprise any alkali silicate but comprises a nonreducing sugar and a base, is also preferable for being used to develop the first and second planographic printing plate precursors of the invention. When this developer is used to develop any one of the planographic printing plate precursors, ink-adsorbing power of the recording layer can be kept better without deteriorating the surface of the recording layer.

The planographic printing plate precursor is generally narrower in development latitude and the image line width and the like vary significantly according to the pH of the developer. Use of a non-silicate developer, which contains a nonreducing sugar having a buffering capacity for suppressing fluctuation of pH, is more advantageous than use of a developer containing a silicate.

Further, the nonreducing sugar stains an electrical conductivity sensor, a pH sensor, and the like used for control of the activity of developer in an amount smaller than that by silicates, which is also more advantageous than the non-silicate developers. The non-silicate developer is also extremely effective in improving the distinctiveness (discrimination) between the image and the nonimage areas. It seems that the contact (penetration) of the developer with the plate precursors, which is important for preservation of the distinctiveness and film physical properties in the invention, becomes milder, increasing the difference between the exposed and unexposed areas.

The nonreducing sugars are sugars having neither aldehyde group nor ketone group and exhibiting no reducing power. The sugars are classified into trehalose type oligosaccharides, in each of which reducing groups are bonded to each other; glucosides, in each of which a reducing group of a sugar is bonded to a non-sugar; and sugar alcohols each obtained by reducing a sugar by hydrogenation. In the invention, any one of these sugars is preferably used. In the present invention, non-reducing sugars described in JP-A 8-305039 Laid-Open can be suitably used.

Examples of the trehalose type oligosaccharides include saccharose and trehalose. Examples of the glucosides include alkylglucosides, phenolglucosides, and mustard seed oil glucoside. Examples of the sugar alcohols include D, L-arabite, ribitol, xylitol, D, L-sorbitos, D, L-mannitol, D, L-iditol, D, L-talitol, dulcitol, and allodulcitol. Furthermore, maltitol, obtained by hydrogenating a disaccharide, and a reductant obtained by hydrogenating an oligosaccharide (i.e., reduced starch syrup) are preferable. Of these examples, sugar alcohol and saccharose are more preferable. D-sorbitol, saccharose, and reduced starch syrup are even more preferable since they have buffer effect within an appropriate pH range and are inexpensive.

These nonreducing sugars may be used alone or in combination of two or more thereof. The percentage thereof in the developer is preferably from 0.1 to 30% by mass, more preferably from 1 to 20% by mass from the viewpoints of the buffer effect and the developing power of the solution.

The base combined with the nonreducing sugar(s) may be an alkali agent that has been known so far. Examples thereof include inorganic alkali agents such as sodium hydroxide, potassium hydroxide, lithium hydroxide, trisodium phosphate, tripotassium phosphate, triammonium phosphate, disodium phosphate, dipotassium phosphate, diammonium phosphate, sodium carbonate, potassium carbonate, ammonium carbonate, sodium hydrogencarbonate, potassium hydrogencarbonate, ammonium hydrogencarbonate, sodium borate, potassium borate and ammonium borate; and organic alkali agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, and pyridine.

The bases may be used alone or in combination of two or more. Among the bases, sodium hydroxide and potassium hydroxide are preferable.

Alternatively in the invention, a solution containing an alkali metal salt of nonreducing sugar as the primary component may be used replacing the combined use of a nonreducing sugar and a base as the non-silicate developer.

Further, an alkaline buffer solution containing a weak acid other than the nonreducing sugars and a strong base may be used as the non-silicate developer. The weak acid is preferably an acid having a dissociation constant (pKa) of 10.0 to 13.2, and may be selected, for example, from the acids described in "Ionization Constants of Organic Acids in Aqueous Solution" published by Pergmon Press or others.

Specifically, preferable examples thereof include alcohols such as 2,2,3,3-tetrafluoropropanol-1, trifluoroethanol, and trichloroethanol; aldehydes such as pyridine-2-aldehyde and pyridine-4-aldehyde; compounds having a phenolic hydroxyl group such as salicyclic acid, 3-hydroxy-2-naphthoic acid, catechol, gallic acid, sulfosalicyclic acid, 3,4-dihydroxysulfonic acid, 3,4-dihydroxybenzoic acid, hydroquinone, pyrogallol, o-, m-, and p-cresols, and resorcinol; oximes such as acetoxime, 2-hydroxybenzaldehyde oxime, dimethylglyoxime, ethanediamide dioxime, and acetophenone oxime; nucleic acid-related substances such as adenosine, inosine, guanine, cytosine, hypoxanthine, and xanthine; as well as diethylaminomethylphosphonic acid, benzimidazole, barbituric acid, and the like.

Various surfactants and organic solvents may be added to the developer and replenisher, for the purpose of increasing or decreasing printing efficiency, dispersing development scum, or improving the compatibility of the image portions on the printing plate with ink. Preferable surfactants are anionic, cationic, nonionic and amphoteric surfactants. Additionally, a reducing agent such as hydroquinone, resorcin, sodium, potassium, or other salt of an inorganic acid such as sulfurous acid or bisulfurous acid, and further an organic carboxylic acid, antiform agent, water softener, or the like may be added to the developer and replenisher as needed.

The planographic printing plate developed with the developer and replenisher above is then subjected to a post-treatment with a rinsing solution containing washing water, a surfactant, and the like and a desensitizing solution containing gum arabic and a starch derivative. Various combinations of these treatments may be used as the post-treatment of the planographic printing plate.

In recent years, automatic developing machines for PS plates have widely been used in order to rationalize and standardize plate-making working in the plate-making and printing industries. The automatic developing machine is generally composed of a developing section and a post-processing section, and comprises a device for carrying PS plates, various processing solution tanks, and spray devices. This machine is a machine for spraying respective processing solutions, which are pumped up, onto an exposed PS plate from spray nozzles while carrying the exposed PS plates horizontally, thereby performing developing and post-processing. Recently, there has also been known a method of immersing and carrying a PS plate in processing solution tanks filled with processing solutions by means of in-liquid guide rolls, or a method of supplying a small amount of washing water onto the surface of a printing plate after development, so as to wash the surface, and then re-using waste water therefrom as water for diluting an undiluted developer.

Such automatic processing can be carried out while replenishers are replenished into the respective processing solutions in accordance with the amounts to be treated, working time, and other factors.

The plate-making method of the present invention is preferably applied to such automatic processing by automatic developing machines as described above.

In the plate-making process to which the plate-making method of the present invention is applied, if unnecessary image areas are present in a planographic printing plate obtained by exposing the planographic printing plate precursor imagewise to light, developing the exposed precursor, and subjecting the developed precursor to water-washing and/or rinsing and/or gamming drawing treatment(s), the unnecessary image areas are erased. The erasing is preferably performed by applying an erasing solution to the unnecessary image areas, leaving the printing plate as it is for a given time, and washing the plate with water, as described in, for example, JP-B No. 2-13293. The erasing may be performed by a method of radiating active rays introduced through an optical fiber onto the unnecessary image areas, and then developing the plate, as described in JP-A No. 59-174842.

After the planographic printing plate thus obtained is optionally coated with a desensitizing gum as described above, the plate can be supplied to a printing process. When it is desired to produce a planographic printing plate having a higher printing durability, burning treatment is applied to the planographic printing plate. In the case that the planographic printing plate is subjected to the burning treatment, it is preferable to treat the plate with a surface-adjusting solution as described in JP-B Nos. 61-2518 or 55-28062, JP-A No. 62-31859 or 61-159655 before the burning treatment.

The method for the treatment is, for example, a method of applying the surface-adjusting solution onto the planographic printing plate with a sponge or absorbent cotton infiltrated with this solution, a method of immersing the planographic printing plate in a vat filled with the surface-adjusting solution, or a method of applying the surface-adjusting solution to the planographic printing plate with an automatic coater. In the case that the applied amount of the solution is made uniform with a squeegee or a squeegee roller after the application thereof, a better result is given.

In general, the applied amount of the surface-adjusting solution is suitably from 0.03 to 0.8 $g/m^2$ (dry mass). The planographic printing plate onto which the surface-adjusting solution is applied is dried if necessary, and then the plate is heated to high temperature by a burning processor (for example, a burning processor (BP-1300) sold by Fuji Photo Film Co., Ltd.) or the like. The heating temperature and the heating time in this case, which depend on the kinds of the components which form the image, are preferably from 180 to 300° C. and from 1 to 20 minutes, respectively.

If necessary, the planographic printing plate subjected to the burning treatment can be subjected to treatments which have been conventionally conducted, such as water-washing treatment and gumming drawing. However, in the case of using the surface-adjusting solution which contains a water soluble polymer compound or the like, the so-called desensitizing treatment (for example, the gumming drawing) can be omitted. The planographic printing plate obtained by such treatments is set to an offset printing machine or some other printing machine, and is used for printing images on a great number of sheets.

EXAMPLES

Hereinafter, the present invention will be described with reference to EXAMPLES, but it should be understood that the scope of the invention is not limited to these EXAMPLES.

[Preparation of Support]

(Preparation of Support 1)

An aluminum plates (an aluminum alloy containing Si: 0.06 wt %; Fe: 0.30 wt %; Cu: 0.014 wt %; Mn: 0.001 wt %; Mg: 0.001 wt %; Zn: 0.001 wt %; Ti: 0.03 wt %; and aluminum and inevitable impurities: balance) having a thickness 0.24 mm was subjected to the following surface treatments continuously.

The surface of the aluminum plate was roughened mechanically with a rotating roller-shaped nylon brush while a suspension of an abrasive (quartz sand) having a specific density of 1.12 in water being supplied as the abrasion slurry solution to the surface of the aluminum plate. The surface was then etched by being sprayed with a solution containing 2.6 wt % caustic soda and 6.5 wt % aluminum ion at a temperature of 70° C., such that 6 g/$m^2$ of the aluminum plate was dissolved. The surface was then washed with water by spraying. The surface was further desmutted by being sprayed with an aqueous solution containing 1 wt % nitric acid (and additionally 0.5 wt % aluminum ion) at a temperature of 30° C., and then washed with water by spraying. The surface was further subjected to a continuously electrochemical surface-roughening treatment by applying a 60-Hz A.C. voltage. The electrolyte used was an aqueous solution containing 10 g/l nitric acid (additionally containing 5 g/l aluminum ion and 0.007 wt % ammonium ion) at a temperature of 80° C. After washing, the aluminum plate was subjected to an etching treatment by being sprayed with a solution containing 26 wt % caustic soda and 6.5 wt % aluminum ion at 32° C., such that 0.20 g/$m^2$ of the aluminum plate was dissolved. The aluminum plate was then washed with water by spraying. The surface was then desmutted by being sprayed with an aqueous solution containing 25 wt % sulfuric acid (and additionally 0.5 wt % aluminum ion) at a temperature of 60° C., and washed with water by spraying.

The surface was then anodized by using an anodic oxidation device by the two-stage electric supply electrolysis method. The electrolyte supplied to the electrolysis cell was sulfuric acid. The aluminum plate was then washed with water by spraying. The final amount of the oxide layer thus formed was 2.7 g/$m^2$.

The anodized aluminum plate was subjected to an alkali metal silicate salt treatment (silicate treatment) by immersing the plate in a 1 wt % aqueous #3 sodium silicate solution at a temperature of 30° C. for 10 seconds. The plate was then washed with water by spraying.

An undercoat solution having the following composition was applied onto the aluminum plate which had been subjected to the silicate treatment as described above. The aluminum plate was dried at 80° C. for 15 seconds, whereby an undercoat film having a dry coating amount of 15 mg/$m^2$ was formed and thus support 1 was produced.

| <Composition of undercaot soluttion> | |
|---|---|
| The following compound | .03 g |
| Methanol | 100 g |
| Water | 1 g |

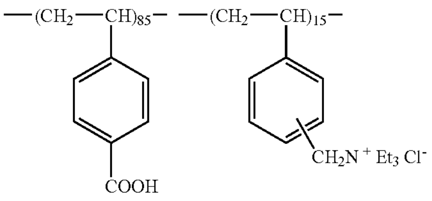

Molecular weight: 28,000

(Preparation of Support 2)

The same aluminum plate as that used in preparation of support 1 was subjected to the following surface treatments continuously.

The surface was electrochemically roughened by applying a 60-Hz A.C. voltage. The electrolyte used was an aqueous solution containing 10 g/l nitric acid (additionally containing 5 g/l aluminum ion and 0.007 wt % ammonium ion) at a temperature of 80° C. After washing, the aluminum plate was etched by being sprayed with a solution containing 26 wt % caustic soda and 6.5 wt % aluminum ion at 32° C., such that 0.20 g/$m^2$ of the aluminum plate was dissolved. The aluminum plate was washed with water by spraying. The surface was then desmutted by being sprayed with an aqueous solution containing 25 wt % sulfuric acid (and additionally 0.5 wt % aluminum ion) at a temperature of 60° C., and washed with water by spraying.

The surface of the aluminum plate electrochemically roughened as described above was subjected to an anodizing treatment, a silicate treatment and an undercoat solution application, in a similar manner to preparation of support 1, whereby support 2 was produced.

(Preparation of Support 3)

An aluminum plate having a thickness of 0.3 mm (material: JIS A 1050) was etched in a solution containing 30 g/l sodium hydroxide and 10 g/l aluminum ion at a liquid temperature of 60° C. for 10 seconds, washed with running water, neutralized with 10 g/l nitric acid, and then washed again. The surface of the aluminum plate was then roughened electrochemically in an aqueous solution containing 15 g/l hydrogen chloride and 10 g/l aluminum ion at a liquid temperature of 30° C. under the condition of an applied voltage Va of 20 V and a current of 500 C/$dm^2$ by using an alternate sine waveform electric current, washed with water, and then etched in a solution containing 30 g/l sodium hydroxide and 10 g/l aluminum ion at a liquid temperature of 40° C. for 10 seconds to effect etching treatment, and washed with running water. Then, the surface was desmutted in an aqueous sulfuric acid solution containing 15 wt % sulfuric acid at a liquid temperature of 30° C., and washed with water. The surface was further anodized in an aqueous 10 wt % sulfuric acid solution at a liquid temperature of 20° C. under the condition of a direct current having an electric current density of 6 A/$dm^2$ until the amount of anodic oxide layer reached to the thickness equivalent to 2.5 g/$m^2$, and then washed with water and dried. The aluminum plate was then treated with an aqueous solution containing 2.5 wt % sodium silicate at 30° C. for 10 seconds, to give a support. The center-line average roughness (Ra) of the support was determined to be 0.48 μm by using a needle having a diameter of 2 μm.

On the silicate-treated aluminum plate thus obtained, an undercoat solution was coated (dried coating amount: 17 $mg/m^2$) in a similar manner to preparation of support 1, whereby support 3 was produced.

(Preparation of Support 4)

Support 4 was prepared by the following treatments (a) to (1) in that order.

(a) Mechanical Surface-Roughening Treatment

JIS-A-1050 aluminum plate having a thickness of 0.3 mm was subjected to mechanical surface roughening by using a rotating roller-shaped nylon brush while supplying a suspension of an abrasive (quartz sand) having a specific density of 1.12 in water as the abrasion slurry solution onto the surface of aluminum plate. The average particle diameter of the abrasive was 8 μm, and the maximum particle diameter was 50 μm. The material for the nylon brush was 6–10 nylon, and the length of the bristles, 50 mm, and the diameter thereof, 0.3 mm. The nylon bristles were planted densely in holes made on the surface of a stainless steel cylinder having a diameter of ϕ300 mm. Three rotating brushes were used. The distance between the two supporting roller (ϕ200 mm) under the brush was 300 mm. The brush rollers were pressed to the aluminum plate, until the load of the drive motor driving the brushes reaches 7 kW larger than the load before the brush roller is pressed thereon. The rotative direction of the brushes is the same as the direction of the moving aluminum plate. The rotational frequency of the brushes was 200 rpm.

(b) Alkaline Etching Treatment

An aqueous NaOH solution (concentration: 26 wt %, and aluminum ion concentration: 6.5 wt %) at a temperature of 70° C. was sprayed onto the aluminum plate thus obtained, for etching treatment, such that 6 $g/m^2$ of the aluminum plate was dissolved. Thereafter, the aluminum plate was washed by being sprayed with water.

(c) Desmutting Treatment

In desmutting treatment, the aluminum plate was sprayed with an aqueous solution containing 1 wt % nitric acid (and containing 0.5 wt % aluminum ion) at a temperature of 30° C. and then washed with water by spraying. Wastewater from the step of the aluminum plate being electrochemically surface-roughened in an aqueous nitric acid solution by using an alternate current was used as the aqueous nitric acid solution used for the desmutting.

(d) Electrochemical Surface-Roughening Treatment

The aluminum plate was subjected to an electrochemical surface-roughening treatment continuously by using a 60-Hz A.C. voltage. The electrolyte used was an aqueous solution containing nitric acid at a content of 10.5 g/l (containing 5 g/l aluminum ion) at a temperature of 50° C. The electrochemical surface-roughening treatment was performed by using a carbon electrode as the counter electrode and a trapezoidal waveform alternate current having an time TP (time from zero electric current to the peak current) of 0.8 msec and a DUTY ratio of 1:1. Ferrite was used as the auxiliary electrode. The electrolytic bath used was a bath in the radial cell type.

The electric current density when the electric current is largest was 30 $A/dm^2$, and the total quantity of electricity when the aluminum plate was used as an anode was 220 $C/dm^2$. 5% of the electric current from the power source was supplied to the auxiliary electrode.

The aluminum plate was then washed with well water by spraying.

(e) Alkaline Etching Treatment

The aluminum plate was etched by being spraying with a solution containing 26 wt % caustic soda and 6.5 wt % aluminum ion at 32° C., until the aluminum plate was dissolved to an amount of 0.20 $g/m^2$; the smuts, which was mainly aluminum hydroxide generated during the electrochemical roughing of the plate surface by using the alternate current in the step (d), were removed and the surface was smoothened by dissolving the edge portions of the pits thus generated. The aluminum plate was then washed with well water by spraying.

(f) Desmutting Treatment

The aluminum plate was desmutted by being sprayed with an aqueous solution containing 15 wt % nitric acid (and aluminum ion at 4.5 wt %) at a temperature of 30° C. and then washed with water by spraying. Wastewater from the step of the aluminum plate being electrochemically surface-roughened in an aqueous nitric acid solution by using the alternate current was used as the aqueous nitric acid solution for this desmutting treatment.

(g) Electrochemical Surface-Roughening Treatment

The aluminum plate was subjected to an electrochemical surface-roughening treatment continuously by using a 60-Hz A.C. voltage. The electrolyte used was an aqueous solution containing 7.5 g/l hydrochloric acid (and 5 g/l aluminum ion) at a temperature of 35° C. The electrochemical surface-roughening treatment was preformed by using an A.C. power having a trapezoidal waveform and using a carbon electrode as the counter electrode. Ferrite was used as the auxiliary anode. The electrolytic bath was a bath in the radial cell type.

The electric current density at the peak of electric current was 25 $A/dm^2$, and the total quantity of electricity when the aluminum plate was used as an anode was 50 $C/dm^2$.

The aluminum plate was then washed with water by spraying.

(h) Alkaline Etching Treatment

The aluminum plate was etched by being sprayed with a solution containing caustic soda at a content of 26 wt % and aluminum ion at a content of 6.5 wt % at 32° C., until the aluminum plate was dissolved to an amount of 0.10 $g/m^2$, and the surface thereof was roughened by using the alternate current above; the smuts mainly of aluminum hydroxide generated were removed and the surface was smoothened by dissolving the edge portions of the bits generated. The aluminum plate was then washed with well water by spraying.

(i) Desmutting Treatment

The aluminum plate was desmutted by being sprayed with an aqueous solution containing 25 wt % sulfuric acid (and 0.5 wt % aluminum ion) at a temperature of 60° C., and then washed with water by spraying.

(j) Anodizing Process

Sulfuric acid was used as the electrolyte. The electrolyte contained 170 g/l sulfuric acid (and 0.5 wt % aluminum ion) and the temperature thereof was 43° C. The aluminum plate was then washed withl water by spraying.

The electric current densities were both approximately 30 A/dm$^2$. The final amount of the oxide layer thus prepared was 2.7 g/m$^2$.

(k) Silicate Treatment

The aluminum plate was subject to a silicate treatment in a similar manner to preparation of support 1. The amount of silicate attached was 3.5 mg/m$^2$.

(l) Formation of Undercoat Film

An undercoat solution was applied in a similar manner to preparation of support 1. The coating amount after drying was 15 mg/m$^2$.

[Preparation of Planographic Printing Plate Precursors 1 to 4]

A coating solution for the undercoat layer beneath photosensitive layer 1 was applied onto the supports 1 to 4 thus obtained, and the resulting coated supports were dried in a PERFECT OVEN PH200 manufactured by TABAI with the Wind Control set at level 7 at 130° C. for 50 seconds, to form an undercoat layer having a dried coating amount of 0.85 g/m$^2$. Then, a coating solution 1 for the upper photosensitive layer was coated thereon in a dried coating amount of 0.25 g/m$^2$. The drying condition was 140° C. for 1 minute.

In this manner, planographic printing plate precursors 1 to 4 for use in the following EXAMPLES of the invention were obtained.

| <Coating solution for upper photosensitive layer 1> | |
|---|---|
| m, p-Cresol novolak (m/p ratio: 6/4, weight average molecular weight: 4,500, containing 0.8 wt. % unreacted cresol) | 0.1000 g |
| Copolymer having the structure shown below (acrylic polymer) | 0.4000 g |
| Cyanine dye A (having the structure above) | 0.0192 g |
| Ammonium compound having the structure shown below | 0.0115 g |
| Magaface F176 (20%) (manufactured by Dainippon Ink and Chemicals, Incorporated., surface-improving surfactant) | 0.022 g |
| 1-Methoxy-2-propanol | 13.07 g |
| Methylethylketone | 6.79 g |

| <Coating solution for the undercoat layer of the photosensitive layer 1> | |
|---|---|
| N-(4-aminosulfonylphenyl) methacrylamide/acrylonitrile/methyl methacrylate (36/34/30 wt %, weight average molecular weight: 50000, and acid value: 2.65) | 2.133 g |
| Cyanine dye A (having the following structure) | 0.109 g |
| 4,4'-bishydroxyphenylsulfone | 0.126 g |
| cis-Δ4-Tetrahydrophthalic anhydride | 0.190 g |
| p-Toluenesulfonic acid | 0.008 g |
| 3-Methoxy-4-diazodiphenylamine hexafluorophosphate | 0.030 g |
| Ethyl violet having 6-hydroxy-2-naphthalenesulfonate as the corner ion | 0.100 g |
| Magaface F176 (manufactured by Dainippoin Ink and Chemicals, Incorporated., coat surface-improving fluorochemical surfactant) | 0.035 g |
| Methylethylketone | 25.38 g |
| 1-Methoxy-2-propanol | 13.0 g |
| Butylolactone | 13.2 g |

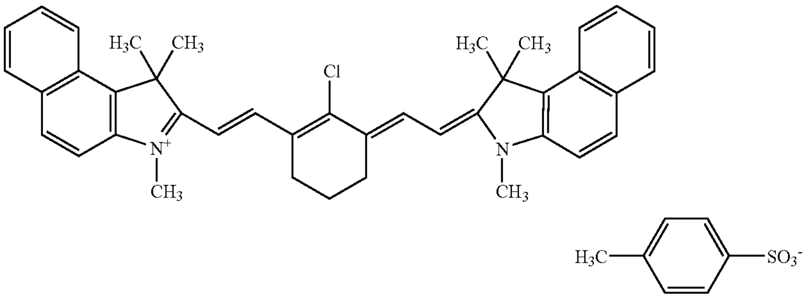

Cyanine dye A

-continued

<Coating solution for upper photosensitive layer 1>

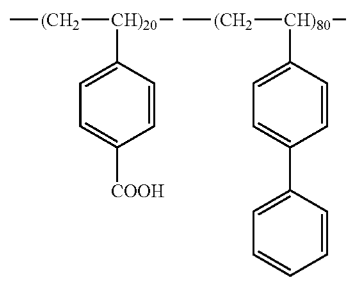

Acrylic polymer Molecular weight 55,000

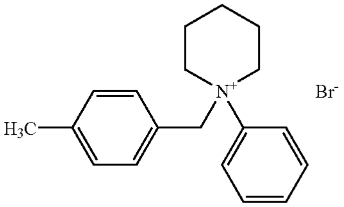

Ammonium compound

EXAMPLE 1

A thin-line image of one-pixel line (line width: 10.4 μm) having the entire side length of 30 mm and a thin-line image of two-pixel line (line width: 20.8 μm) having the entire side length of 30 mm were each irradiated on the planographic printing plate precursor 1 obtained as described above (i.e., on support 1 having a photosensitive layer formed thereon; 650 mm×550 mm×0.3 mm thickness) by using a plate setter, Luxcel Plate setter 9000CTP, (manufactured by Fuji Photo Film Co., Ltd., rotational frequency: 1,000 rpm, and resolution: 2,438 dpi) under a plurality of conditions while changing the plate-surface energy incrementally at an interval of 13.5 mW from 13.5 mW to 270.0 mW. Specifically, the incremental exposure was conducted by changing the plate-surface energy in the order of 13.5 mW, 27.0 mW, 30.5 mW, 243.0 mW, 256.5 mW, and 270.0 mW.

Subsequently, the plate was developed under the following condition, to give a standard developer-processed planographic printing plate 1 developed with a standard developer (alkaline developer A; 45 mS/cm).

(Development)

A scrubbing element having a rotational velocity of 120 rpm and a contact width of 2.5 mm was connected to the washing portion of an automatic developing machine containing a developing dip tank. The contact width between the plate and the scrubbing element, which was a rotating brush roll planted with nylon bristles (diameter: 70 μm, and length: 10 mm), was set to 2 mm.

In the developing tank of this automatic developing machine, 27 liters of a developer having the following composition [alkaline developer A (pH: about 13)] was placed and kept at 30° C. Tap water (8 liter) was placed in the washing tank. Eight liters of a diluted finishing gum solution [FG-1 (manufactured by Fuji Photo Film Co., Ltd.)/water=1/1] was placed in the finisher tank.

| <Composition of alkaline developer A> | |
|---|---|
| D-sorbit | 2.5 wt % |
| Sodium hydroxide | 0.85 wt % |
| Diethylenetriamine penta(methylenephosphonate) 5Na salt | 0.05 wt % |
| Water | 96.6 wt % |

The planographic printing plate precursor after exposure was developed in an automatic developing machine under the condition of a first replenishment-controlling impedance of 45.0 mS/cm and a developing time of 12 seconds by supplying the following replenishing development solution B.

| <Composition of replenishing development solution B> | |
|---|---|
| D-sorbit | 5.6 wt % |
| Sodium hydroxide | 2.5 wt % |
| Diethylenetriamine penta(methylenephosphonate) 5Na salt | 0.2 wt % |
| Water | 91.7 wt % |

The image densities of one-pixel line and two-pixel line formed on the standard developer-processed planographic printing plate 1 thus obtained were determined by using a reflection densitometer (D19C type) manufactured by GRETAG, and the exposure intensity (thin-line sensitivity) that provide the two images with the same density was determined. The thin-line sensitivity was 216 mW.

Then, printing was continued at a rate of 100 plates a day for 3 months, by using a print image of AM screen having a density of 175 lines/inch, at an exposure intensity of 216 mW under the aforementioned developing condition.

In a similar manner to above, a test developer-processed planographic printing plate 1 was first prepared every day and the thin-line sensitivity thereof was determined. If the thin-line sensitivity became beyond the ±13.5 mW range, the conditions for the plate-making step were adjusted according to the quality-control method of the invention as described below.

On the 18th day, the thin-line sensitivity increased to 202.5 mW, and thus the setting exposure intensity was changed to 202.5 mW according to the quality-control method of the invention.

On the 45th day, the thin-line sensitivity decreased to 216 mW, and the setting exposure intensity was changed to 216 mW according to the quality-control method of the invention.

After then to the 90th day, the development was continued in a stabilized state.

Therefore, it is concluded that, without use of the control method according to the invention, the automatic developing machine would have operated only for 18 days in the condition that provides favorable planographic printing plates. These results clearly demonstrate the effectiveness of the evaluation method and quality-control method according to the invention.

EXAMPLE 2

A thin-line image of one pixel line (line width: 10.4 μm) having the entire side length of 30 mm and a thin-line image of eight-pixel line (line width: 83.2 μm) having the entire side length of 30 mm were each irradiated on the planographic printing plate precursor 2 obtained as described above (i.e., on support 2 having a photosensitive layer formed thereon; 650 mm×550 mm×0.24 mm thickness) by using a plate setter, Trendsetter 3244F, manufactured by Creo Inc. (rotational frequency: 360 rpm, and resolution: 2438 dpi) under a plurality of conditions by changing the plate-surface energy at an interval of 0.75 W from 0.75 W to 15.0 W. Specifically, the incremental exposure was conducted by changing the plate-surface energy in the order of 0.75 W, 1.5 W, 2.25 W, . . . , 13.5 W, 14.25 W, and 15.0 W.

Subsequently, the plate was developed under the conditions similar to those in EXAMPLE 1, to give a standard developer-processed planographic printing plate 2 developed with a standard developer (alkaline developer A; 45 mS/cm).

The image densities of one-pixel line and eight-pixel line formed on the standard developer-processed planographic printing plate 2 thus obtained were determined (reflection densitometer Type D 19C, manufactured by GRETAG Co., Ltd.), and the exposure intensity (thin-line sensitivity) that provided the two images with the same density was determined. The thin-line sensitivity was 12.0 W.

Then, printing was continued at a rate of 100 plates a day for 3 months by using a print image of AM screen having a density of 175 lines/inch at an exposure intensity of 12.0 mW under the aforementioned developing condition.

In a similar manner to above, a test developer-processed planographic printing plate 2 was first prepared every day and the thin-line sensitivity thereof was determined. If the thin-line sensitivity became beyound the ±0.75 mW range, the conditions of the plate-making step were adjusted according to the quality-control method of the invention as described below.

On the 21st day, the thin-line sensitivity increased to 11.25 mW, and the setting exposure intensity was changed to 11.25 mW according to the quality-control method of the invention.

On the 40th day, the thin-line sensitivity decreased to 12.0 mW, and the setting exposure intensity was changed to 12.0 mW according to the quality-control method of the invention.

On the 58th day, the thin-line sensitivity decreased to 12.75 mW, and the setting exposure intensity was changed to 12.75 mW according to the quality-control method of the invention.

After then to the 90th day, the development was continued in a stabilized state.

It is concluded that, without use of the control method according to the invention, the automatic developing machine would have operated only for 18 days in the condition that provides favorable planographic printing plates. These results clearly demonstrate the effectiveness of the evaluation method and quality-control method according to the invention.

EXAMPLE 3

Images of one-pixel line (line width: 10.4 μm) having the entire side length of 30 mm and two-pixel line (line width: 20.8 μm) having the entire side length of 30 mm were each irradiated on the planographic printing plate precursor 3 obtained as described above (i.e., on support 3 having a photosensitive layer formed thereon; 650 mm×550 mm×0.3 mm thickness) by using a plate setter, Luxcel Plate Setter 9000CTP, (manufactured by Fuji Photo Film Co., Ltd.) (rotational frequency: 1,000 rpm, and resolution: 2,438 dpi) under plurality of conditions effected by changing the plate-surface energy, at an interval of 13.5 mW, from 13.5 mW to 270.0 mW. Specifically, the incremental exposure was conducted by changing the plate-surface energy in the order of 13.5 mW, 27.0 mW, 3.05 mW, . . . , 243.0 mW, 256.5 mW, and 270.0 mW.

Subsequently, the plate was developed under the conditions similar to those in EXAMPLE 1, to give a standard developer-processed planographic printing plate 3 developed with a standard developer (alkaline developer A; 45 mS/cm).

The image densities of the one-pixel and two-pixel lines formed on the standard developer-processed planographic printing plate 3 thus obtained were determined by a reflection densitometer (D 19C type, manufactured by GRETAG), and the exposure intensity (thin-line sensitivity) that provides the two images with the same density was determined. The thin-line sensitivity was 216 mW.

Then, printing was continued at a rate of 100 plates a day for 3 months by using a print image of FM screen (Creo Staccato 10) at an exposure intensity of 216 mW under the aforementioned developing condition.

In a similar manner to above, a test developer-processed planographic printing plate 3 was first prepared every day and the thin-line sensitivity thereof was determined. If the thin-line sensitivity was beyond the predetermined value by ±13.5 mW or more, the conditions of the plate-making step were adjusted according to the quality-control method of the invention as described below.

On the 16th day, the thin-line sensitivity increased to 202.5 mW, and thus the electrical conductivity of the developer was changed from 45 mS/cm to 44 mS/cm according to the quality-control method of the invention, resulting in restoration of the original thin-line sensitivity.

On the 38th day, the thin-line sensitivity decreased to 229.5 mW, and thus the temperature of the developing was changed from 30° C. to 31° C. according to the quality-control method of the invention, resulting in restoration of the original thin-line sensitivity.

After then to the 90th day, the development was continued in a stabilized state.

It is concluded that, without use of the control method according to the invention, the automatic developing machine would have operated only for 18 days in the condition that provides favorable planographic printing plates. These results clearly demonstrate the effectiveness of the evaluation method and quality-control method according to the invention.

EXAMPLE 4

Images of one-pixel line (line width: 10.4 μm) having the entire side length of 30 mm and eight-pixel line (line width: 83.2 μm) having the entire side length of 30 mm were each irradiated on the planographic printing plate precursor 4 obtained as described above (i.e., on support 4 having a photosensitive layer formed thereon; 650 mm×550 mm×0.24 mm thickness) by using a plate setter, Trendsetter 3244F manufactured by Creo Inc., (rotational frequency: 360 rpm, and resolution 2438 dpi) under a plurality of conditions effected by changing the plate-surface energy at an interval of 0.75 W from 0.75 W to 15.0 W. Specifically, the incremental exposure was conducted by changing the plate-surface energy, in the order of 0.75 W, 1.5 W, 2.25 W, . . . , 13.5 W, 14.25 W, and 15.0 W.

Subsequently, the plate was developed under the conditions similar to those in EXAMPLE 1, to give a standard developer-processed planographic printing plate 4 developed with a standard developer (alkaline developer A: 45 mS/cm).

The image densities of the one-pixel and eight-pixel lines formed on the standard developer-processed planographic printing plate 3 thus obtained were determined by a reflection densitometer (D19C type, manufactured by GRETAG), and the exposure intensity (thin-line sensitivity) that provides the two images with the same density was determined. The thin-line sensitivity was 12.0 W.

Then, printing was continued at a rate of 100 plates a day for 3 months by using a print image of FM screen (Creo Staccato 10) at an exposure intensity of 12.0 W under the aforementioned developing condition.

In a similar manner to above, a developer-processed planographic printing plate 4 was first prepared every day and the thin-line sensitivity thereof was determined. If the thin-line sensitivity was beyond the predetermined value by ±0.75 mW or more, the conditions of the plate-making step were adjusted according to the quality-control method of the invention as described below.

On the 24th day, the thin-line sensitivity increased to 11.25 W, and thus the temperature of the development solution was changed from 30° C. to 29° C. according to the quality-control method of the invention, resulting in restoration of the original thin-line sensitivity.

On the 46th day, the thin-line sensitivity decreased to 12.75 W, and thus the temperature of the developer was changed back to 30° C. according to the quality-control method of the invention, resulting in restoration of the original thin-line sensitivity.

On the 65th day, the thin-line sensitivity decreased to 12.75 W, and thus the contact width between the rotating brush roll and the plate was changed from 2 mm to 3 mm according to the quality-control method of the invention, resulting in restoration of the original thin-line sensitivity.

After then to the 90th day, the development was continued in a stabilized state.

It is concluded that, without use of the control method according to the invention, the automatic developing machine would have operated only for 24 days in the condition that provides favorable planographic printing plates. These results clearly demonstrate the effectiveness of the evaluation method and quality-control method according to the invention.

EXAMPLE 5

A checked image of one pixel (each square has the side length of 10.4 μm) having the entire side length 30 mm and another checked image of eight pixels (each square has the side length of 83.2 μm) having the entire side length 30 were each irradiated on the planographic printing plate precursor 4 obtained as described above (i.e., on support 4 having a photosensitive layer formed thereon; 650 mm×550 mm×0.24 mm thickness) by using a plate setter, Trendsetter 3244F manufactured by Creo Inc., (rotational frequency: 360 rpm, and resolution 2,438 dpi) under a plurality of conditions effected by changing the plate-surface energy at an interval of 0.75 W from 0.75 W to 15.0 W. The incremental exposure was conducted by changing the plate-surface energy, in the order of 0.75 W, 1.5 W, 2.25 W, . . . , 13.5 W, 14.25 W, and 15.0 W.

Subsequently, the plate was developed under the conditions similar to those in EXAMPLE 1, to give a standard developer-processed planographic printing plate 5 developed with a standard developer (alkaline developer A; 45 mS/cm).

The image densities of the one-pixel and eight-pixel lines formed on the standard developer-processed planographic printing plate 5 thus obtained were determined by using a reflection densitometer (D19C type, manufactured by GRETAG), and the exposure intensity (checked-image sensitivity) that provides the two checked-images with the same density was determined. The thin-line sensitivity was 12.0 W.

Then, printing was continued at a rate of 100 plates a day for 3 months by using a print image of FM screen (Creo Staccato 10), at an exposure intensity of 12.0 W under the aforementioned developing condition.

In a similar manner to above, a developer-processed planographic printing plate 5 was first prepared every day and the thin-line sensitivity thereof was determined. If the thin-line sensitivity was beyound the predetermined value by ±0.75 mW or more, the conditions of the plate-making step were adjusted according to the quality-control method of the invention as described below.

On the 31st day, the thin-line sensitivity increased to 11.25 W, and thus the temperature of the development solution was changed from 30° C. to 29° C. according to the quality-control method of the invention, resulting in restoration of the original checked-image sensitivity.

On the 56th day, the thin-line sensitivity decreased to 12.75 W, and thus the temperature of the developing was changed back to 30° C. according to the quality-control method of the invention, resulting in restoration of the original thin-line sensitivity.

On the 72nd day, the thin-line sensitivity decreased to 12.75 W, and thus the contact width between the rotating brush roll and the plate was changed from 2 mm to 3 mm according to the quality-control method of the invention, resulting in restoration of the original thin-line sensitivity.

After then to the 90th day, the development was continued in a stabilized state.

It is concluded that, without use of the control method according to the invention, the automatic developing machine would have operated only for 24 days in the condition that provides favorable planographic printing plates. These results clearly demonstrate the effectiveness of the evaluation method and quality-control method according to the invention.

Summarizing the EXAMPLES above, use of the evaluation method and quality-control method according to the invention is effective in controlling the developing process either by adjusting the exposure or developing condition.

What is claimed is:

1. A method for evaluating planographic printing plates, comprising the steps of:

(a) preparing a planographic printing plate precursor having a support and a photosensitive layer provided on the support, the photosensitive layer containing an aqueous alkaline solution-soluble resin and a compound that generates heat by absorbing light;

(b) setting one image using as a reference a length of a side of one pixel of predetermined resolution;

(c) setting at least one other image using as a reference a length of two to eight pixels of the predetermined resolution;

(d) irradiating the one image and the at least one other image on the photosensitive layer by incrementally altering plate-surface energy;

(e) forming a standard developer-processed planographic printing plate by developing an exposed planographic printing plate with a standard developer;

(f) identifying an exposure intensity that respectively provides the one image and the at least one other image formed on the standard developer-processed planographic printing plate with identical density;

(g) forming a test developer-processed planographic printing plate by developing a planographic printing plate prepared and exposed under the same conditions as in the steps (a) to (d), with a developer to be evaluated;

(h) identifying an exposure intensity that respectively provides the one image and the at least one other image formed on the test developer-processed planographic printing plate with identical density; and (i) comparing the exposure intensity determined in the step (f), which respectively provides the one image and the at least one other image formed on the standard developer-processed planographic printing plate with identical density, with the exposure intensity obtained in the step (h), which respectively provides the one image and the at least one other image formed on the test developer-processed planographic printing plate developer with identical density.

2. The method for evaluating planographic printing plates according to claim 1, wherein the one image is an image comprising one-pixel lines, each having a width equal to the length of a side of one pixel of the predetermined resolution, aligned regularly at an interval equal to the width of the one-pixel lines, that is, with nonimage portions aligned therebetween.

3. The method for evaluating planographic printing plates according to claim 1, wherein the at least one other image is an image comprising lines having a different width, selected from two- to eight-pixel lines, aligned regularly at an interval equal to the width of the lines having a different width, that is, with nonimage portions aligned therebetween.

4. The method for evaluating planographic printing plates according to claim 1, wherein the one image is a checked image combining one-pixel squares of predetermined resolution.

5. The method for evaluating planographic printing plates according to claim 1, wherein the at least one other image is a checked image combining squares of a different length, selected from two- to eight-pixel lines.

6. The method for evaluating planographic printing plates according to claim 1, comprising a further step (j) of adjusting plate-making conditions when results of comparison in the step (i) show a difference between respective thin-line sensitivities that exceeds a predetermined value.

7. The method for evaluating planographic printing plates according to claim 6, wherein if the exposure intensity that respectively provides the one image and the at least one other image formed on the test developer-processed planographic printing plate developer with identical density exceeds the exposure intensity that respectively provides the one image and the at least one other image formed on the standard developer-processed planographic printing plate with identical density, by the predetermined value, developing properties of the test developer are judged to have deteriorated and exposure conditions are intensified or developing conditions are further fortified.

8. The method for evaluating planographic printing plates according to claim 6, wherein if the exposure intensity that respectively provides the one image and the at least one other image formed on the test developer-processed planographic printing plate with identical density is less than the exposure intensity that respectively provides the one image and the at least one other image formed on the standard developer-processed planographic printing plate with identical density, by the predetermined value, developing properties of the test developer are judged to be excessive and exposure conditions or developing conditions are moderated.

9. The method for evaluating planographic printing plates according to claim 6, wherein the predetermined value corresponds to 10% of the exposure intensity determined in the step (f).

10. The method for evaluating planographic printing plates according to claim 1, wherein the step (d) includes a step of setting the range of exposure intensity for exposure by incrementally altering the plate-surface energy to between an exposure intensity at which density is no different from that of an unexposed portion and an exposure intensity 1.5 times larger than exposure intensities determined in the steps (f) and (h).

11. The method for evaluating planographic printing plates according to claim 1, wherein the step (d) includes a step of setting variation in the plate-surface energy so as to correspond to a range of 2 to 10% of the clear sensitivity of an image developed with the standard developer.

12. A method for evaluating planographic printing plates, comprising:

a step (A) of subjecting a planographic printing plate precursor having a support and a photosensitive layer provided on the support, the photosensitive layer containing an aqueous alkaline solution-soluble resin and a compound that generates heat by absorbing light, to exposure such that a thin-line image of a one-pixel line and at least one thin-line image selected from two- to eight-pixel lines of predetermined resolution are exposed by incrementally altering the plate-surface energy; producing a standard developer-processed planographic printing plate by developing the exposed plate precursor with a standard developer; identifying an exposure intensity, i.e., a thin-line sensitivity, that respectively provides the thin-line image of the one-pixel line and the at least one thin-line image selected from two- to eight-pixel lines with identical density;

a step (B) of forming a test developer-processed planographic printing plate by developing a planographic printing plate, exposed to images identical to those in step (A) under identical exposure conditions, with a developer to be evaluated; and identifying an exposure intensity, i.e., a thin-line sensitivity, that respectively provides the thin-line image of the one-pixel line and the at least one thin-line image selected from two- to eight-pixel lines with identical density; and a step (C) of comparing the thin-line sensitivity of the standard developer-processed planographic printing plate and the thin-line sensitivity of the test developer-processed planographic printing plate.

13. The method for evaluating planographic printing plates according to claim 12, wherein the thin-line image of the one-pixel line is an image comprising one-pixel lines, each having a width equal to the length of a side of one pixel of predetermined resolution, aligned regularly at an interval equal to the width of the one-pixel lines, that is, with nonimage portions aligned therebetween.

14. The method for evaluating planographic printing plates according to claim 12, wherein the at least one thin-line image selected from two- to eight-pixel lines is an image comprising lines having a different width, selected from two- to eight-pixel lines, aligned regularly at an interval equal to the width of the lines having a different width, that is, with nonimage portions aligned therebetween.

15. The method for evaluating planographic printing plates according to claim 12, comprising a further step (D) of adjusting plate-making conditions when results of comparison in the step (C) show a difference between respective exposure intensities that exceeds a predetermined value.

16. The method for evaluating planographic printing plates according to claim 15, wherein if a plate-making condition adjusted in the step (D) is a developing condition, the steps (A) to (D) are repeated in the same order once or multiple times and under the same conditions except that the developing condition in the step (A) is changed to the developing condition adjusted in previous step (D).

17. The method for evaluating planographic printing plates according to claim 15, wherein if a plate-making condition adjusted in step (D) is an exposure condition, the steps (A) to (D) are carried out in that order once or multiple times under the same conditions, except that the test developer-processed planographic printing plate obtained in previous step (B) is regarded as the standard developer-processed planographic printing plate in step (A).

18. A method for evaluating planographic printing plates, comprising:

a step (A) of subjecting a planographic printing plate precursor having a support and a photosensitive layer provided on the support, the photosensitive layer containing an aqueous alkaline solution-soluble resin and a compound that generates heat by absorbing light, to exposure such that a checked image of a one-pixel and at least one checked image selected from two- to eight-pixel images of predetermined resolution are exposed by incrementally altering the plate-surface energy; forming a standard developer-processed planographic printing plate by developing the exposed plate precursor with a standard developer; and identifying an exposure intensity or a checked-image sensitivity that respectively provides the checked image of one pixel and the at least one checked image selected from two- to eight-pixel images, with identical density;

a step (B) of forming a test developer-processed planographic printing plate by developing a planographic printing plate, exposed to images identical to those in step (A) under identical conditions, with a developer to be evaluated; and identifying an exposure intensity or a checked-image sensitivity that respectively provides the checked image of one pixel and the at least one checked image selected from two- to eight-pixel images, with identical density; and a step (C) of comparing the checked-image sensitivity of the standard developer-processed planographic printing plate with that of the test developer-processed planographic printing plate.

19. The method for evaluating planographic printing plates according to claim 18, comprising a further step (D) of adjusting plate-making conditions when results of comparison in the step (C) show a difference between respective exposure intensities that exceeds a predetermined value.

20. The method for evaluating planographic printing plates according to claim 19, wherein if a plate-making condition adjusted in the step (D) is a developing condition, the steps (A) to (D) are repeated in the same order once or multiple times and under the same conditions except that the developing condition in the step (A) is changed to the developing condition adjusted in previous step (D).

21. The method for evaluating planographic printing plates according to claim 19, wherein if a plate-making condition adjusted in step (D) is an exposure condition, the steps (A) to (D) are carried out in that order once or multiple times under the same conditions, except that the test developer-processed planographic printing plate obtained in previous step (B) is regarded as the standard developer-processed planographic printing plate in step (A).

* * * * *